(12) United States Patent
Um et al.

(10) Patent No.: US 11,342,403 B2
(45) Date of Patent: May 24, 2022

(54) DISPLAY PANEL AND ELECTRONIC APPARATUS INCLUDING THE SAME

(71) Applicant: Samsung Display Co., Ltd., Yongin-si (KR)

(72) Inventors: Nuree Um, Yongin-si (KR); Hyungjun Park, Yongin-si (KR); Junyong An, Yongin-si (KR); Kyeonghwa Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

(21) Appl. No.: 16/864,615

(22) Filed: May 1, 2020

(65) Prior Publication Data
US 2021/0167160 A1 Jun. 3, 2021

(30) Foreign Application Priority Data
Dec. 3, 2019 (KR) .......................... 10-2019-0159368

(51) Int. Cl.
*H01L 27/32* (2006.01)
*H01L 51/00* (2006.01)
*H01L 51/52* (2006.01)

(52) U.S. Cl.
CPC ........ *H01L 27/3276* (2013.01); *H01L 27/323* (2013.01); *H01L 27/3234* (2013.01); *H01L 51/0096* (2013.01); *H01L 51/524* (2013.01); *H01L 51/5253* (2013.01); *H01L 51/5281* (2013.01)

(58) Field of Classification Search
CPC ............... H01L 27/3276; H01L 27/323; H01L 27/3234; H01L 51/5281; H01L 51/524; H01L 51/5253; H01L 51/0096; Y02E 10/549
See application file for complete search history.

(56) References Cited

U.S. PATENT DOCUMENTS

| | | |
|---|---|---|
| 8,890,181 B2 | 11/2014 | Wang et al. |
| 9,785,032 B2 | 10/2017 | Chiang et al. |
| 10,171,636 B2 | 1/2019 | Yeo et al. |
| 10,418,434 B2 | 9/2019 | Kim et al. |

(Continued)

FOREIGN PATENT DOCUMENTS

| | | |
|---|---|---|
| CN | 108828861 A | 11/2018 |
| KR | 10-2017-0112790 A | 10/2017 |
| KR | 10-2017-0114026 A | 10/2017 |

*Primary Examiner* — Kyoung Lee
(74) *Attorney, Agent, or Firm* — Lewis Roca Rothgerber Christie LLP

(57) ABSTRACT

A display panel having at least one hole inside a display area includes: a substrate; a plurality of display elements arranged in a plane around the at least one hole; and a plurality of signal lines extending in a first direction, wherein the at least one hole includes a first hole having a first width in a second direction and having two sides with asymmetric shapes with respect to a first central line passing through a center of the first width, wherein each of first and second neighboring signal lines extends in the first direction, the first signal line detours around a first side of the first hole, and the second signal line detours around a second side of the first hole opposite to the first side, and wherein the first and second signal lines are asymmetric with respect to a first virtual line therebetween.

30 Claims, 25 Drawing Sheets

(56) References Cited

U.S. PATENT DOCUMENTS

| | | |
|---|---|---|
| 2016/0054636 A1 | 2/2016 | Chiang et al. |
| 2018/0076416 A1 | 3/2018 | Cho et al. |
| 2019/0123066 A1* | 4/2019 | Zhan .................... H01L 27/1218 |
| 2020/0013842 A1* | 1/2020 | Lee ...................... H01L 27/3276 |

* cited by examiner

DISPLAY PANEL AND ELECTRONIC APPARATUS INCLUDING THE SAME

CROSS-REFERENCE TO RELATED APPLICATION

This application claims priority to and the benefit of Korean Patent Application No. 10-2019-0159368, filed on Dec. 3, 2019, in the Korean Intellectual Property Office, the entire disclosure of which is hereby incorporated by reference.

BACKGROUND

1. Field

One or more embodiments relate to a display panel and an electronic apparatus including the same.

2. Description of Related Art

Recently, the purposes of display devices have been diversifying. In addition, as display devices have become thinner and more lightweight, their range of use has gradually been extended.

As display devices are used in various suitable ways, their shapes may be designed in various suitable ways. Also, functions that may be combined or associated with display devices are increasing.

SUMMARY

Aspects and features of the present disclose are directed toward a display device capable of increasing functions that may be combined or associated with the display device. One or more embodiments of the present disclose provide a display panel including a plurality of regions inside a display area, in which a camera, a sensor, etc. may be arranged, and an electronic apparatus. However, in this case, designing an arrangement of wirings around the plurality of regions is difficult.

One or more embodiments of the present disclosure provide a structure that may prevent or reduce the deterioration of display quality by appropriately arranging wirings around the plurality of regions. However, it should be understood that embodiments described herein should be considered in a descriptive sense only and not for purposes of limitation.

Additional aspects will be set forth, in part, in the description that follows and, in part, will be apparent from the description, or may be learned by practice of the presented embodiments of the disclosure.

According to one or more embodiments, a display panel having at least one hole inside a display area includes a substrate, a plurality of display elements arranged on the substrate, the plurality of display elements arranged in a plane around the at least one hole and defining the display area, and a plurality of signal lines electrically connected to the plurality of display elements and extending in a first direction, wherein the at least one hole includes a first hole, the first hole having a first width in a second direction different from the first direction and having two sides which have asymmetric shapes with respect to a first central line passing through a center of the first width, wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side, and wherein the first signal line and the second signal line are asymmetric with respect to a first virtual line between the first signal line and the second signal line.

The first virtual line may be spaced apart in the second direction from the first central line.

The display panel may further include an intermediate area located between the first hole and the display area, and the first signal line may include a first detouring portion that detours around the first side of the first hole in the intermediate area, and the second signal line may include a second detouring portion that detours around the second side of the first hole in the intermediate area.

The first detouring portion and the second detouring portion may have an asymmetric shape with respect to the first virtual line.

A first distance interval between the first signal line and the second signal line in the display area may be greater than a distance interval between the first signal line and the second signal line in the intermediate area.

One of the first signal line and the second signal line may include a first conductive layer, and a second conductive layer located on the first conductive layer with an insulating layer therebetween, the second conductive layer being connected to the first conductive layer through a contact hole in the insulating layer.

The plurality of signal lines may further include a third signal line located on one side of the second signal line with the first signal line therebetween, and a fourth signal line located on one side of the first signal line with the second signal line therebetween, and the third signal line and the fourth signal line may be asymmetric with respect to the first virtual line.

Each of the first signal line and the third signal line may include an extension portion extending in the first direction, and a detouring portion connected to the extension portion and arranged around the first side of the first hole, and a first connection point between the extension portion and the detouring portion of the first signal line, and a second connection point between the extension portion and the detouring portion of the third signal line may be arranged on a first virtual oblique line that is oblique with respect to the first direction and the second direction.

The plurality of signal lines may include data lines or scan lines.

Each of the plurality of display elements may include an organic light-emitting diode.

According to one or more embodiments, a display panel having a first hole includes a plurality of display elements arranged in a plane around the first hole, and a plurality of signal lines electrically connected to the plurality of display elements and extending in a first direction, wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side, wherein the first signal line and the second signal line are asymmetric with respect to a first virtual line between the first signal line and the second signal line.

Each of the first signal line and the second signal line may include extension portions each extending in the first direction and being spaced apart from each other, and a detouring portion connected to each of the extension portions, wherein the detouring portion of the first signal line detours around the first side of the first hole, and the detouring portion of the second signal line detours around the second side of the first hole, and the detouring portion of the first signal line and the detouring portion of the second signal line may be asymmetric with respect to the first virtual line.

The plurality of signal lines may further include a third signal line located on one side of the second signal line with the first signal line therebetween, and a fourth signal line located on one side of the first signal line with the second signal line therebetween, and the third signal line and the fourth signal line may be asymmetric with respect to the first virtual line.

The third signal line may include an extension portion extending in the first direction, and a detouring portion connected to the extension portion and arranged around the first side of the first hole, and a first connection point between one of the extension portions and the detouring portion of the first signal line, and a second connection point between the extension portion and the detouring portion of the third signal line may be arranged along a first virtual oblique line that is oblique with respect to the first direction.

The fourth signal line may include an extension portion extending in the first direction, and a detouring portion connected to the extension portion and arranged around the second side of the first hole, and a third connection point between one of the extension portions and the detouring portion of the second signal line, and a fourth connection point between the extension portion and the detouring portion of the fourth signal line may be arranged along a second virtual oblique line that is oblique with respect to the first direction.

Each of the first signal line and the fourth signal line may include a first conductive layer, and a second conductive layer located on the first conductive layer with an insulating layer therebetween, the second conductive layer being connected to the first conductive layer through a contact hole in the insulating layer.

The detouring portion of the first signal line may be spaced apart by a constant distance from the first side of the first hole, and the detouring portion of the second signal line may be spaced apart by a constant distance from the second side of the first hole.

The first hole may have a first width in a second direction different from the first direction and two sides of the first hole may have an asymmetric shape with respect to a first central line passing through a center of the first width in the first direction.

The first virtual line may be spaced apart from the first central line in the second direction.

The first virtual line and the first central line may be the same line, and a width or a thickness of one of the detouring portion of the first signal line and the detouring portion of the second signal line may be greater than a width or a thickness of the other of the detouring portion of the first signal line and the detouring portion of the second signal line.

The display panel may include a substrate, a display layer on the substrate and including the plurality of display elements, and an encapsulation layer on the display layer, and the first hole may pass through a stacked structure including the substrate, the display layer, and the encapsulation layer.

According to one or more embodiments, an electronic apparatus includes a display panel having a first hole, and at least one component corresponding to the first hole of the display panel, wherein the display panel includes a plurality of display elements arranged in a plane around the first hole, and a plurality of signal lines electrically connected to the plurality of display elements and extending in a first direction, wherein each of a first signal line of the plurality of signal lines and a second signal line of the plurality of signal lines and neighboring the first signal line extends in the first direction, the first signal line includes a first detouring portion that detours around a first side of the first hole, the second signal line includes a second detouring portion that detours around a second side of the first hole opposite to the first side, and wherein the first detouring portion of the first signal line and the second detouring portion of the second signal line are asymmetric with respect to a first virtual line between the first signal line and the second signal line.

The plurality of signal lines may further include a third signal line located on one side of the second signal line with the first signal line therebetween and including a third detouring portion that detours around the first side of the first hole, and a fourth signal line located on one side of the first signal line with the second signal line therebetween and including a fourth detouring portion that detours around the first side of the first hole, and wherein the third detouring portion of the third signal line and the fourth detouring portion of the fourth signal line may be asymmetric with respect to the first virtual line.

The first signal line may include an extension portion extending in the first direction and the first detouring portion may be connected to the extension portion, the third signal line may include an extension portion extending in the first direction and the third detouring portion may be connected to the extension portion, and a first connection point between the extension portion of the first signal line and the first detouring portion, and a second connection point between the extension portion of the third signal line and the third detouring portion may be arranged along a first virtual oblique line that is oblique with respect to the first direction.

The first hole may have a first width in a second direction different from the first direction and two sides of the first hole may have asymmetric shapes with respect to a first central line passing through a center of the first width.

The first virtual line may be spaced apart in the second direction from the first central line.

The first virtual line and the first central line may be the same line, and a width or a thickness of one of the first detouring portion and the second detouring portion may be greater than a width or a thickness of the other of the first detouring portion and the second detouring portion.

The at least one component may include an electronic element that emits light or receives light through the first hole.

The electronic element may include a camera, a sensor to recognize a portion of a human body, or a lamp.

The display panel may further have a second hole spaced apart from the first hole, and the display panel may further include an additional component corresponding to the second hole.

These and other aspects and features will become more apparent and will be more readily appreciated from the following description of the embodiments, the accompanying drawings, and the claims and equivalents thereof.

BRIEF DESCRIPTION OF THE DRAWINGS

The above and other aspects and features of the present disclosure will become more apparent from the following description taken in conjunction with the accompanying drawings, in which.

DETAILED DESCRIPTION

Figure 1A:
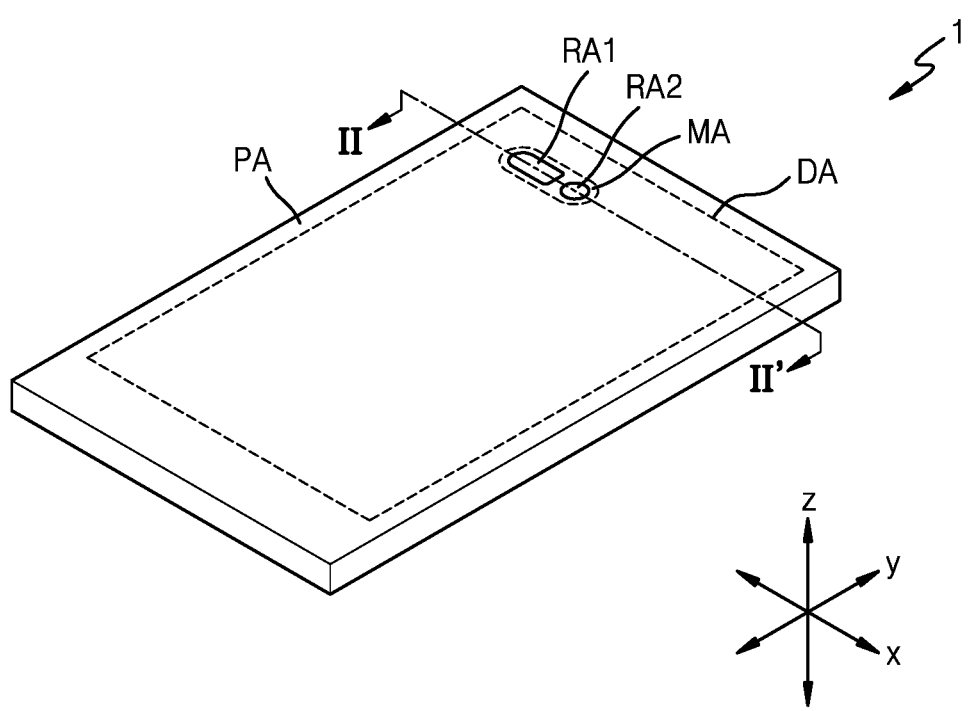
FIGS. 1A and 1B are each a perspective view of an electronic apparatus according to an embodiment.

Reference will now be made to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects and features of the present disclosure. As used herein, the use of the term "may," when describing embodiments of the present invention, refers to "one or more embodiments of the present invention." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various suitable changes and numerous embodiments, example embodiments will be illustrated in the drawings and described in the written description. The aspects and features of the present disclosure and a method of accomplishing the same will be apparent when referring to embodiments described herein below together with the drawings. However, the present disclosure is not limited to embodiments described herein below and may be implemented in various forms.

Hereinafter, the disclosed embodiments are described with reference to the accompanying drawings. In the drawings, the same reference numerals are given to the same or corresponding elements, and repeated description thereof may not be provided again.

It will be understood that although the terms "first," "second," etc. may be used herein to describe various components, these components should not be limited by these terms. These terms are only used to distinguish one component from another.

As used herein, the singular forms "a," "an," and "the" are intended to include the plural forms as well, unless the context clearly indicates otherwise.

It will be further understood that the terms "comprises" and "comprising" used herein specify the presence of stated features or components, but do not preclude the presence or addition of one or more other features or components.

It will be understood that when a layer, region, or component is referred to as being "on" another layer, region, or component, it can be directly or indirectly on the other layer, region, or component. For example, intervening layer(s), region(s), or component(s) may be present. In contrast, when an element or layer is referred to as being "directly on" another layer, region, or component, there are no intervening layers, regions, or components.

Sizes of elements in the drawings may be exaggerated for convenience of explanation. For example, sizes and thicknesses of components in the drawings may be exaggerated for convenience of explanation, and the following embodiments are not limited thereto. As used herein, the term "substantially," "about," "approximately," and similar terms are used as terms of approximation and not as terms of degree, and are intended to account for the inherent deviations in measured or calculated values that would be recognized by those of ordinary skill in the art.

When a disclosed embodiment may be implemented differently, a disclosed process order may be performed differently from the described order. For example, two consecutively described processes may be performed at or substantially at the same time or may be performed in an order opposite to the described order.

It will be understood that when a layer, region, or component is referred to as being "connected" to another layer, region, or component, it may be "directly connected" to the other layer, region, or component or it may be "indirectly connected" to the other layer, region, or component with other layer(s), region(s), or component(s) interposed therebetween. For example, it will be understood that when a layer, region, or component is referred to as being "electrically connected" to another layer, region, or component, it may be "directly electrically connected" to the other layer, region, or component or it may be "indirectly electrically connected" to the other layer, region, or component through other layer(s), region(s), and/or component(s) electrically interposed therebetween. Further, as used herein, when one layer, region, or component is referred to as being "connected" or "coupled" to another layer, region, or component, the one layer, region, or component may, for example, be electrically connected or electrically coupled to the other layer, region, or component to operate.

Figure 1B:
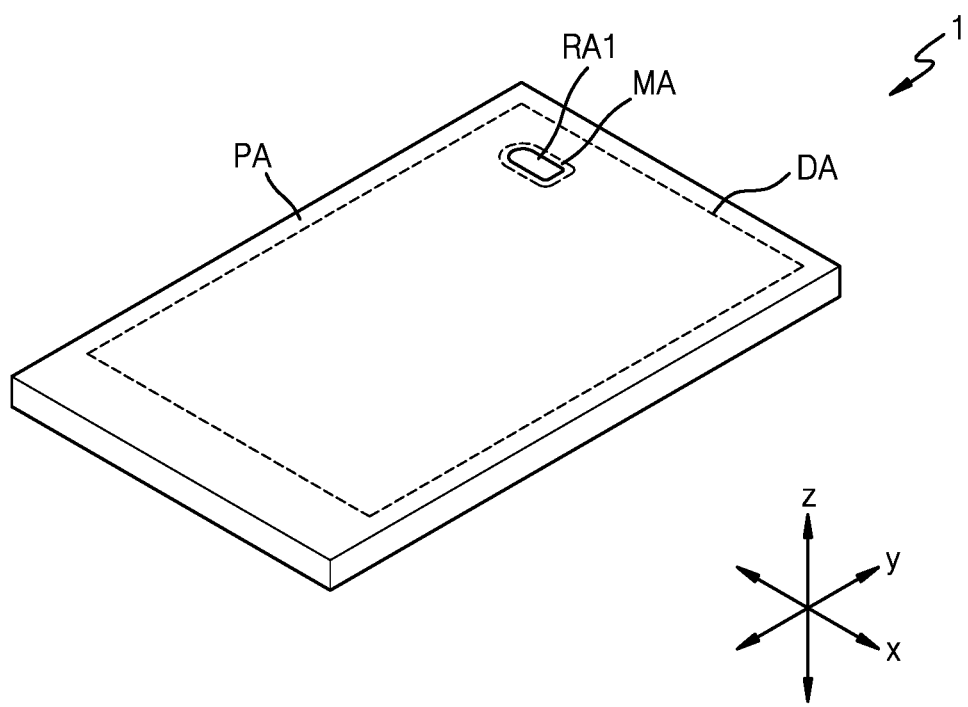

FIGS. 1A and 1B are each a perspective view of an electronic apparatus 1 according to an embodiment.

Figure 2A:
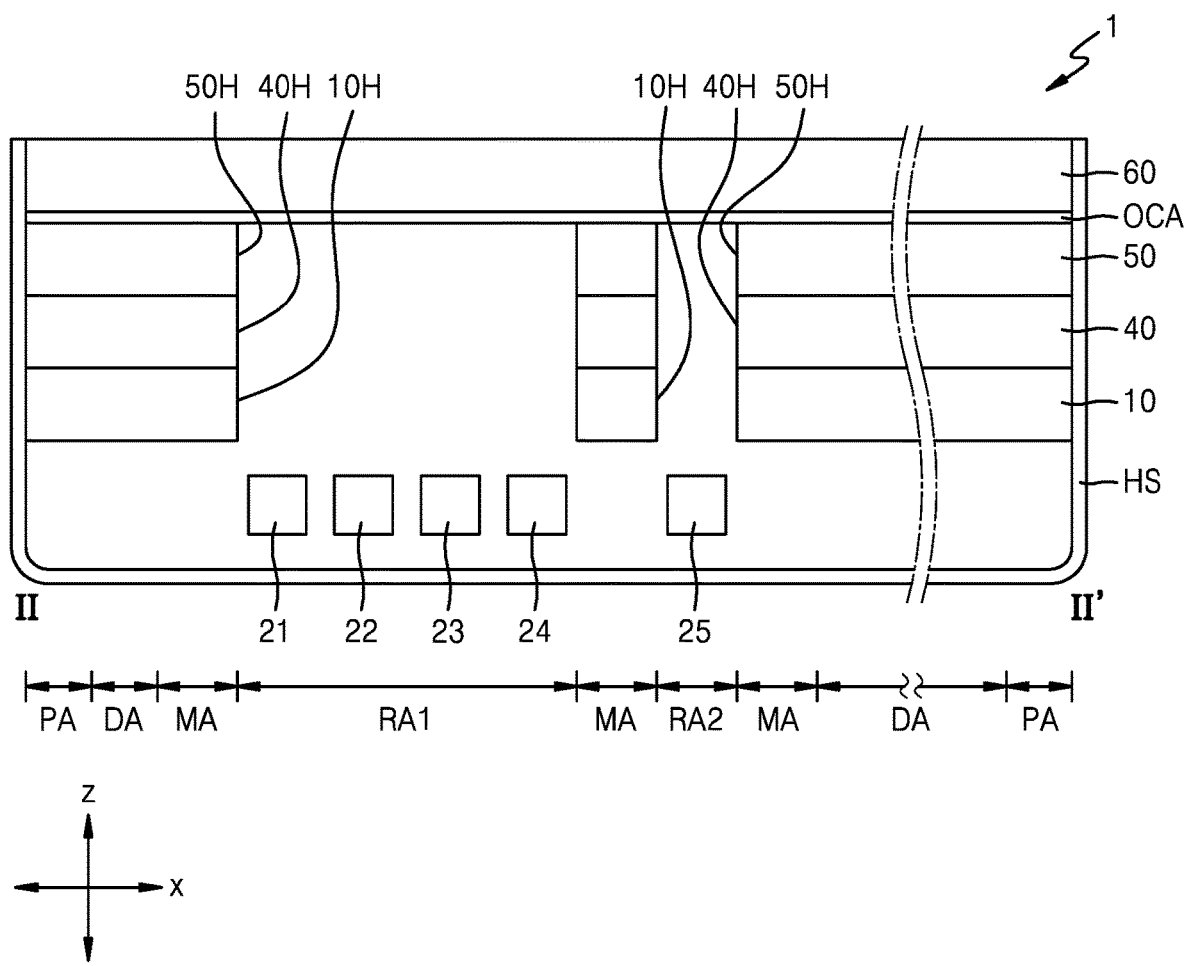
FIGS. 2A to 2C are each a cross-sectional view of a display device according to an embodiment.
Figure 2B:
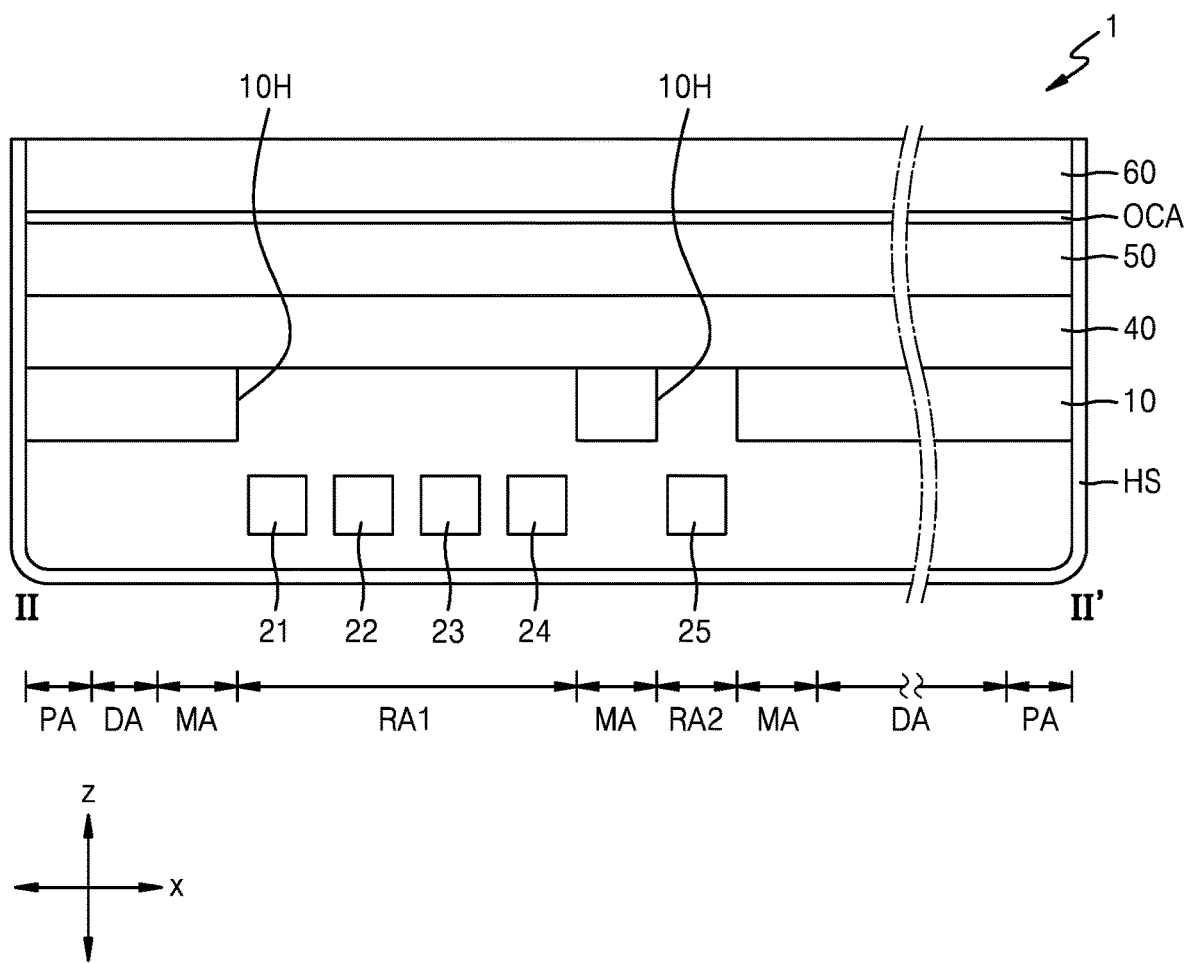
Figure 2C:
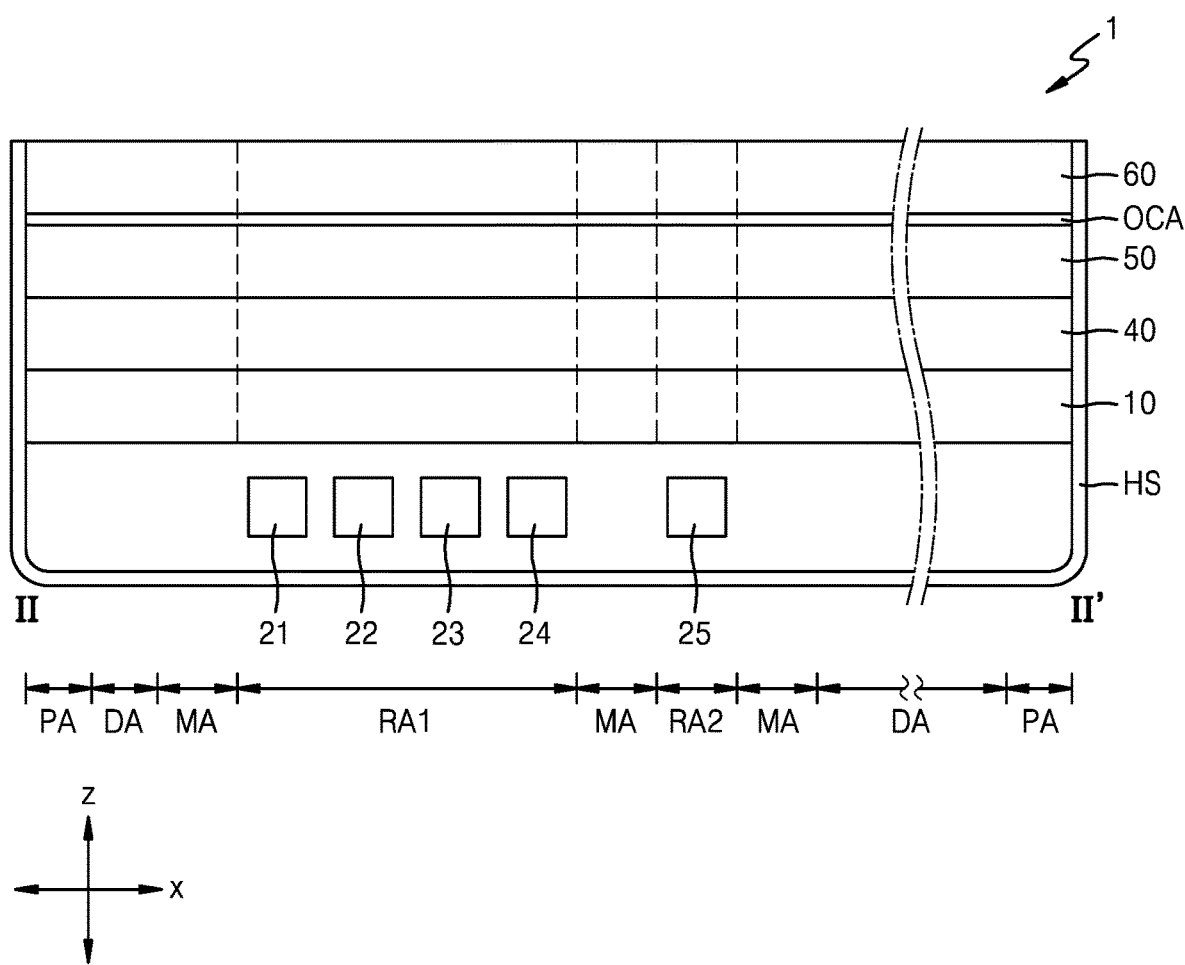

The electronic apparatus 1 may include at least one component area arranged inside a display area DA. For example, as shown in FIG. 1A, two component areas, for example, a first region RA1 and a second region RA2, may be arranged inside the display area DA. In some embodiments, as shown in FIG. 1B, one component area, for example, the first region RA1, may be arranged inside the display area DA. The first region RA1 and the second region RA2 are regions in which a component, described below with reference to FIGS. 2A to 2C, is arranged. The electronic apparatus 1 may have various suitable functions by utilizing the component.

In the case where the electronic apparatus 1 includes a plurality of component areas, the first region RA1 and the second region RA2 may have different sizes (e.g., areas) and/or different shapes. The first region RA1 may have an atypical shape that is asymmetric with respect to a horizontal direction (e.g., an x-direction) and/or a longitudinal direction (e.g., a y-direction). For example, as shown in FIGS. 1A and 1B, the first region RA1 may have an asymmetric shape with respect to a line along a longitudinal direction (e.g., the y-direction). The second region RA2 may have a symmetric shape with respect to a horizontal direction (e.g., an x-direction) and/or a longitudinal direction (e.g., a y-direction). For example, as shown in FIG. 1A, the second region RA2 may have a shape such as a circle, an oval (ellipse), or a quadrangle.

The display area DA may display a predetermined or set image by utilizing light emitted from a plurality of pixels arranged in the display area DA. Each pixel may include a display element to emit light of a predetermined or set color. For example, display elements to emit red, green, or blue light may be arranged two-dimensionally in an x-direction and a y-direction (e.g., arranged in a plane parallel to both the x-direction and the y-direction), and the display area DA that displays an image may be defined (e.g., may be defined by an area including display elements).

An intermediate area MA may be arranged between at least one component area and the display area DA. In some embodiments, the intermediate areas may be adjacent to the component areas, for example, immediately surrounding at least a portion of, or all of, the component areas. The display area DA may be surrounded by a peripheral area PA. The intermediate area MA and the peripheral area PA may be a kind of non-display area in which pixels are not arranged. The intermediate area MA may be entirely surrounded by the display area DA, and the display area DA may be surrounded by the peripheral area PA.

The electronic apparatus 1 may include various suitable kinds of apparatuses that may provide an image, such as tablet personal computers (PC), notebook computers, mobile phones, and smart bands or smart watches that may be worn on a wrist.

FIGS. 2A to 2C are each a cross-sectional view of a display device according to an embodiment, taken along line II-II' of FIG. 1A.

Referring to FIGS. 2A to 2C, the electronic apparatus 1 has a space therein and includes a housing HS having one open side. The one open side of the housing HS may be coupled to (e.g., coved by) a window 60. A stacked structure may be arranged (e.g., arranged in the housing HS), the stacked structure including a display panel 10, an input sensing layer 40, and an optical functional layer 50. At least one component may be arranged below a backside (e.g., lower surface) of the display panel 10. Although FIGS. 2A to 2C show first to fifth components 21, 22, 23, 24, and 25, the number of components and a kind of component may be variously and suitably changed.

The first to fifth components 21, 22, 23, 24, and 25 may be arranged inside the housing HS and located between the display panel 10 and a bottom surface or portion of the housing HS. Some of the first to fifth components 21, 22, 23, 24, and 25 may be arranged in the first region RA1, and the rest of the first to fifth components 21, 22, 23, 24, and 25 may be arranged in the second region RA2. In an embodiment, the first to fourth components 21, 22, 23, and 24 may be arranged in the first region RA1, and the fifth component 25 may be arranged in the second region RA2.

The first to fifth components 21, 22, 23, 24, and 25 may include electronic elements that utilize light and/or sound. The electronic element may include (e.g., be) a sensor to measure a distance such as a proximity sensor, a sensor to recognize a portion (e.g., a fingerprint, an iris, a face, etc.) of a user's body, a small lamp to output light, and/or an image sensor (e.g., a camera) to capture an image. The electronic element that utilizes light may utilize light in various suitable wavelength bands including visible light, infrared light, and/or ultraviolet light. The electronic element that utilizes sound may utilize ultrasonic waves and/or sound in other frequency bands.

Light and/or sound utilized by the electronic element may progress to (e.g., may be received by) the first to fifth components 21, 22, 23, 24, and 25, and/or may be emitted from the first to fifth components 21, 22, 23, 24, and 25 through the first and second regions RA1 and RA2. Therefore, the first and second regions RA1 and RA2 may be a kind of transmission area that may transmit light and/or sound.

The first to fifth components 21, 22, 23, 24, and 25 may include electronic elements of the same kind or may include electronic elements of different kinds. In an embodiment, the first component 21 and the fifth component 25 may include image sensors (e.g., cameras), and the second to fourth components 22, 23, and 24 may include at least one infrared sensor.

The infrared sensor may include a light emitter and a light receiver. The light emitter and the light receiver may be formed in one body or may be separately formed as independent elements. In an embodiment, the second to fourth components 22, 23, and 24 may each include a portion of one infrared sensor. For example, some of the second to fourth components 22, 23, and 24 may include a light emitter that emits light and the rest of the second to fourth components 22, 23, and 24 may include a light receiver that receives light.

The display panel 10 may display an image. The display panel 10 may display an image by utilizing the display elements, for example, organic light-emitting diodes arranged in the display area DA. In an embodiment, the display element may include an inorganic light-emitting diode or a quantum-dot light-emitting diode.

The input sensing layer 40 obtains coordinate information corresponding to an external input, for example, a touch event. The input sensing layer 40 includes a sensing electrode (e.g., a touch electrode) and a trace line connected to the sensing electrode. The input sensing layer 40 may be arranged on the display panel 10. The input sensing layer 40 may sense an external input by utilizing a mutual capacitance method and/or a self-capacitance method.

As shown in FIGS. 2A to 2C, the input sensing layer 40 may be directly formed on the display panel 10. For example, the input sensing layer 40 may be successively formed after a process of forming the display panel 10. In some embodiments, an adhesive layer may not be arranged between the input sensing layer 40 and the display panel 10. In some embodiments, the input sensing layer 40 may be formed separately and then coupled to the display panel 10 by utilizing an adhesive layer. The adhesive layer may include (e.g., be) an optically clear adhesive (OCA).

The optical functional layer 50 may include a reflection prevention layer. The reflection prevention layer may reduce the reflectivity of light (external light) incident onto the display panel 10 from the outside through the window 60. In some embodiments, the reflection prevention layer may reduce the amount of light (e.g., external light) incident upon the display panel 10. The reflection prevention layer may include a retarder and a polarizer. The retarder may include a film-type retarder (e.g., film-based retarder) or a liquid crystal-type retarder (e.g., liquid crystal-based retarder). The retarder may include a λ/2 retarder (e.g., half-wave plate retarder) and/or a λ/4 retarder (e.g., quarter-wave plate retarder). The polarizer may include a film-type polarizer (e.g., film-based polarizer) or a liquid crystal-type polarizer (e.g., liquid crystal-based polarizer). The film-type polarizer (e.g., film-based polarizer) may include a stretchable synthetic resin film, and the liquid crystal-type polarizer (e.g., liquid crystal-based polarizer) may include liquid crystals arranged in a predetermined or set arrangement. Each of the retarder and the polarizer may further include a protective film. The retarder and the polarizer themselves or the protective film of the retarder and the polarizer may be defined as a base layer of the reflection prevention layer.

In another embodiment, the reflection prevention layer may include a black matrix and color filters. The color filters may be arranged by taking into account colors of pieces of light (e.g., based on the colors of light) emitted respectively from the pixels of the display panel 10. For example, red color filters that filter red light may be arranged to overlap pixels that emit red light. In another embodiment, the reflection prevention layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere, and thus the reflectivity of external light may be reduced.

The optical functional layer 50 may include a lens layer. The lens layer may improve emission efficiency of light emitted from the display panel 10 or reduce color deviation. The lens layer may include a layer having a concave or convex lens shape and/or include a plurality of layers having different refractive indexes. The optical functional layer 50 may include the reflection prevention layer and/or the lens layer.

The optical functional layer 50 may be coupled to the window 60 through an adhesive layer such as an OCA.

The display panel 10, the input sensing layer 40, and/or the optical functional layer 50 may respectively have holes in the first region RA1 and the second region RA2. In an embodiment, as shown in FIG. 2A, the display panel 10, the input sensing layer 40, and the optical functional layer 50 respectively have first to third holes 10H, 40H, and 50H overlapping each other. The first hole 10H may be formed to pass through a top surface to a bottom surface of the display panel 10. The second hole 40H may be formed to pass through a top surface to a bottom surface of the input sensing layer 40. The third hole 50H may be formed to pass through a top surface to a bottom surface of the optical functional layer 50. Each of the first to third holes 10H, 40H, and 50H may be located to correspond to (e.g., to overlap) the first and second regions RA1 and RA2. The first and second regions RA1 and RA2 may each be a kind of hole region (e.g., a region corresponding to a hole(s), for example, to the first hole 10H, the second hole 40H, and/or the third hole 50H). Sizes (e.g., diameters, breadths, or areas) of the first to third holes 10H, 40H, and 50H may be equal to, or different from, each other. Although FIG. 2A shows that the OCA may be entirely formed on a backside (e.g., a bottom side) of the window 60, the OCA may include holes in the first region RA1 and/or the second region RA2 in an embodiment.

In some embodiments, the display panel 10, the input sensing layer 40, and/or the optical functional layer 50 do not include a hole. For example, in some embodiments, as shown in FIG. 2B, the display panel 10 may include the first holes 10H corresponding to the first and second regions RA1 and RA2, but the input sensing layer 40 and the optical functional layer 50 do not include a hole. In some embodiments, when light and/or sound sufficiently pass through the first and second regions RA1 and RA2, each of the display panel 10, the input sensing layer 40, and the optical functional layer 50 do not include the holes corresponding to the first and second regions RA1 and RA2, for example, as shown in FIG. 2C.

Figure 3A:
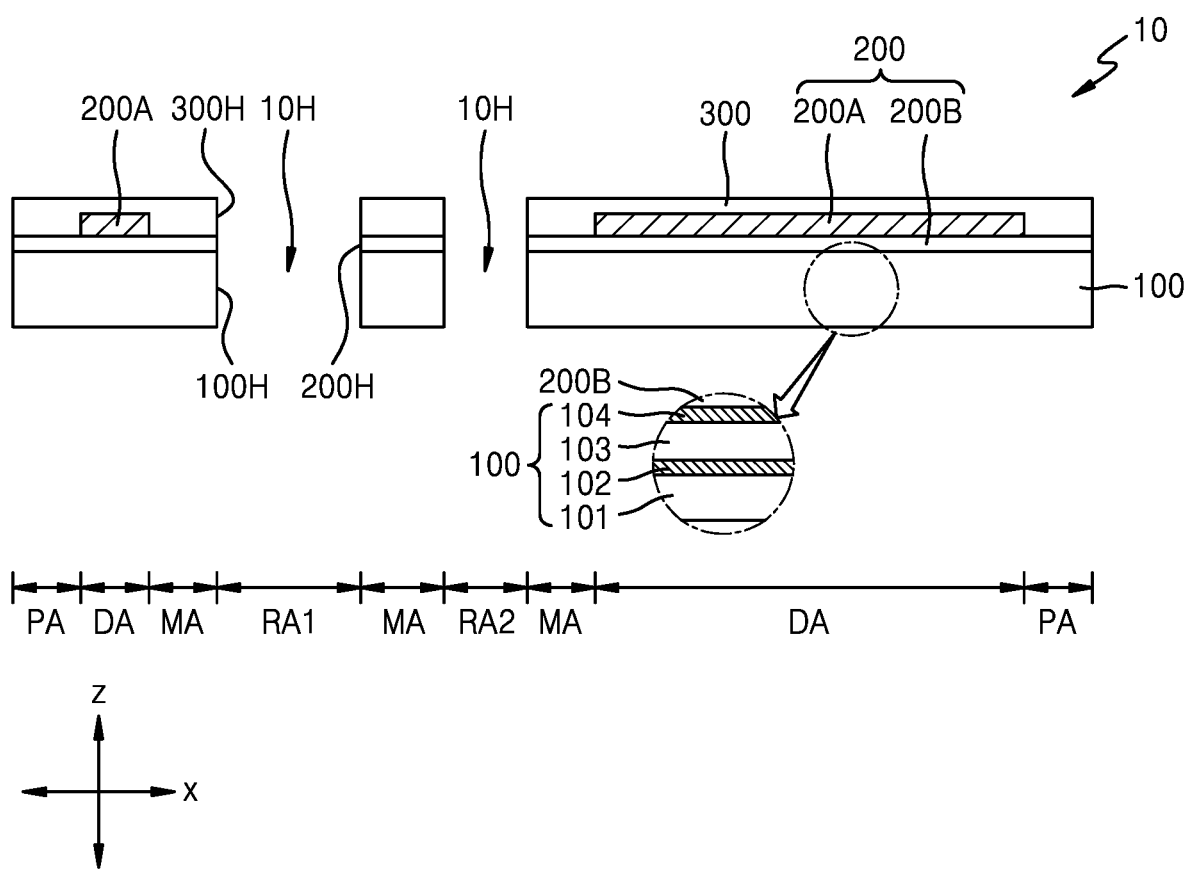
FIGS. 3A and 3B are each a cross-sectional view of a display panel according to an embodiment.
Figure 3B:
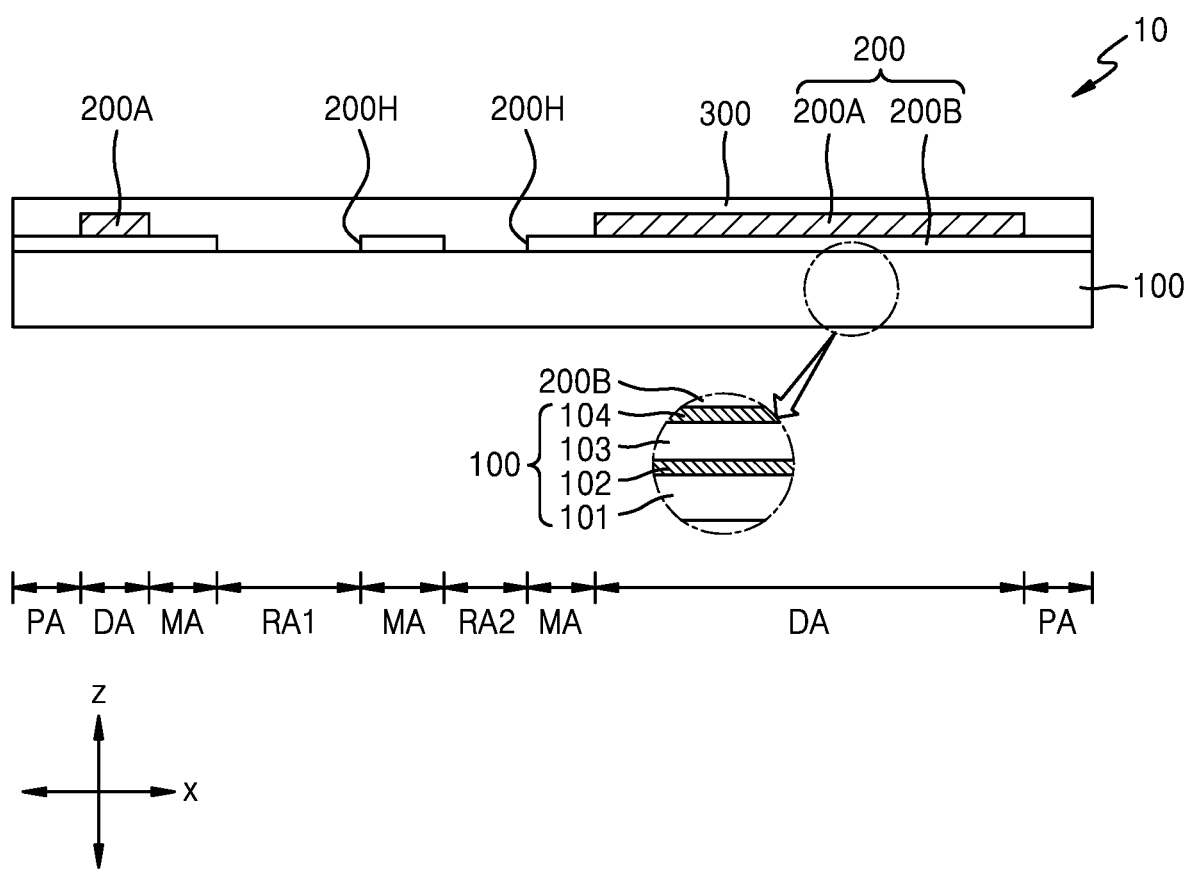

FIGS. 3A and 3B are each a cross-sectional view of the display panel 10 according to an embodiment.

Referring to FIG. 3A, the display panel 10 includes a display layer 200 arranged on a substrate 100. The substrate 100 may include (e.g., be) a glass material and/or a polymer resin. The substrate 100 may include a multi-layer structure. For example, as shown in an enlarged view of the substrate 100 in FIG. 3A, the substrate 100 may include a first base layer 101, a first barrier layer 102, a second base layer 103, and a second barrier layer 104.

Each of the first and second base layers 101 and 103 may include (e.g., be) a polymer resin. For example, the first and second base layers 101 and 103 may include (e.g., be) a polymer resin such as polyethersulfone (PES), polyarylate (PAR), polyetherimide (PEI), polyethylene naphthalate (PEN), polyethylene terephthalate (PET), polyphenylene sulfide (PPS), polyacrylate, polyimide (PI), polycarbonate, cellulose tri acetate (TAC), and/or cellulose acetate propionate (CAP). The polymer resin may be transparent.

The first and second barrier layers 102 and 104 are barrier layers to prevent or block the penetration of external foreign substances and may include a single layer or a multi-layer structure including (e.g., being) an inorganic material such as silicon nitride, silicon oxynitride, and/or silicon oxide.

The display layer 200 includes a plurality of pixels. The display layer 200 may include a display element layer 200A, a pixel circuit layer 200B, and insulating layers. The display element layer 200A may include display elements arranged for each pixel, and the pixel circuit layer 200B may include pixel circuits electrically connected to each display element. Each pixel circuit may include a thin film transistor and a storage capacitor, and each display element may include an organic light-emitting diode.

The display elements of the display layer 200 may be covered by a thin-film encapsulation layer 300. The thin-film encapsulation layer 300 may include at least one inorganic encapsulation layer and at least one organic encapsulation layer. For example, the thin-film encapsulation layer 300 may have a structure in which a first inorganic encapsulation layer and a second inorganic encapsulation layer are sequentially stacked. In some embodiments, the first inorganic encapsulation layer, the organic encapsulation layer, and the second inorganic encapsulation layer may be sequentially stacked in this order. The first and second inorganic encapsulation layers may include (e.g., be), for example, at least one of silicon nitride, silicon oxide, or silicon oxynitride. The organic encapsulation layer may include (e.g., be) a polymer-based material. The polymer-based material may include (e.g., be) an acryl-based resin, an epoxy-based resin, polyimide, and/or polyethylene.

In the case where the display panel 10 includes the substrate 100 and the thin-film encapsulation layer 300, which may be multi-layer structures, the flexibility of the display panel 10 may be improved. The display panel 10 may include the first holes 10H passing through the display panel 10. The first holes 10H may be respectively located in the first and second regions RA1 and RA2. It is shown in FIG. 3A that the substrate 100, the display layer 200, and an encapsulation member, which is the thin-film encapsulation layer 300, respectively include through holes 100H, 200H, and 300H, each corresponding to the first hole 10H of the display panel 10.

In another embodiment, as shown in FIG. 3B, the substrate 100 and the thin-film encapsulation layer 300 do not include a through hole. Because the components are arranged in the first region RA1 and the second region RA2 as described above, the display layer 200 may include the through holes 200H in the first region RA1 and the second region RA2, and a transmittance by which light may pass may be secured through the through holes 200H. For example, in some embodiments, even though the substrate 100 and the thin-film encapsulation layer 300 do not include a through hole, the through holes 200H in the display layer 200 may allow light to pass through the display panel 10.

Figure 4A:
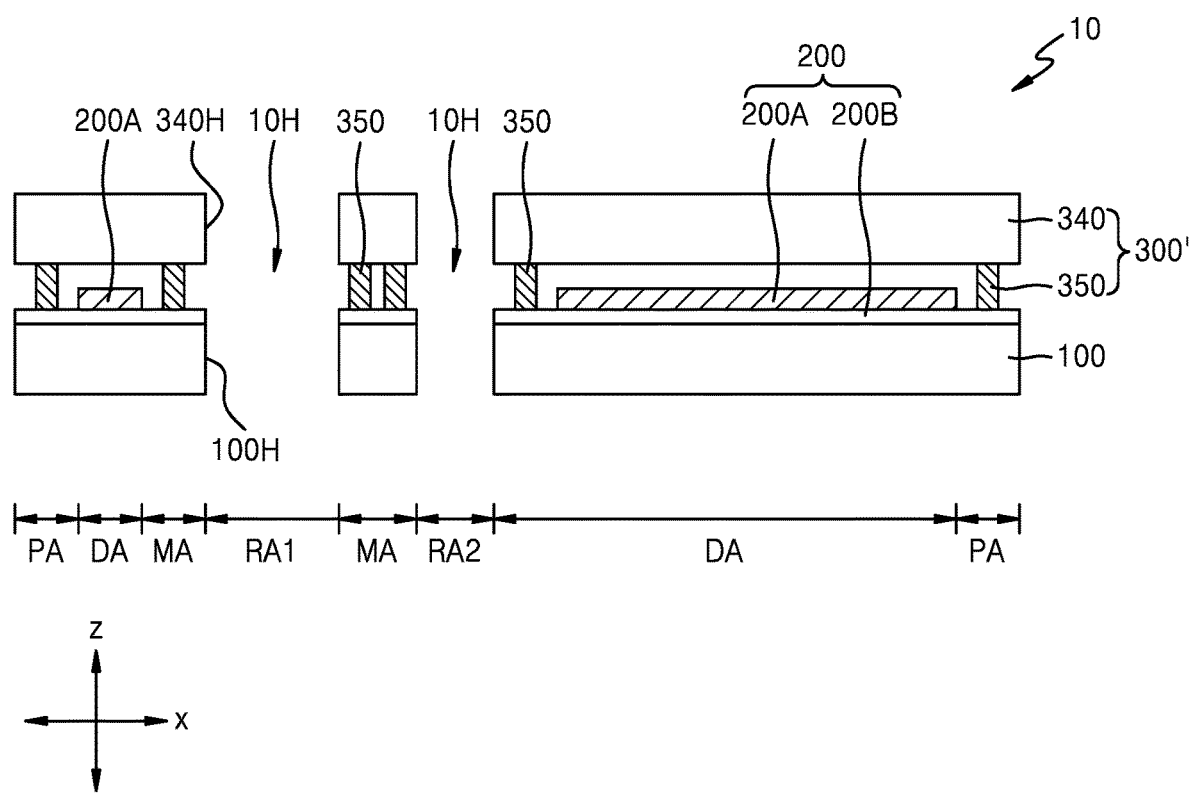
FIGS. 4A and 4B are each a cross-sectional view of a display panel according to an embodiment.
Figure 4B:
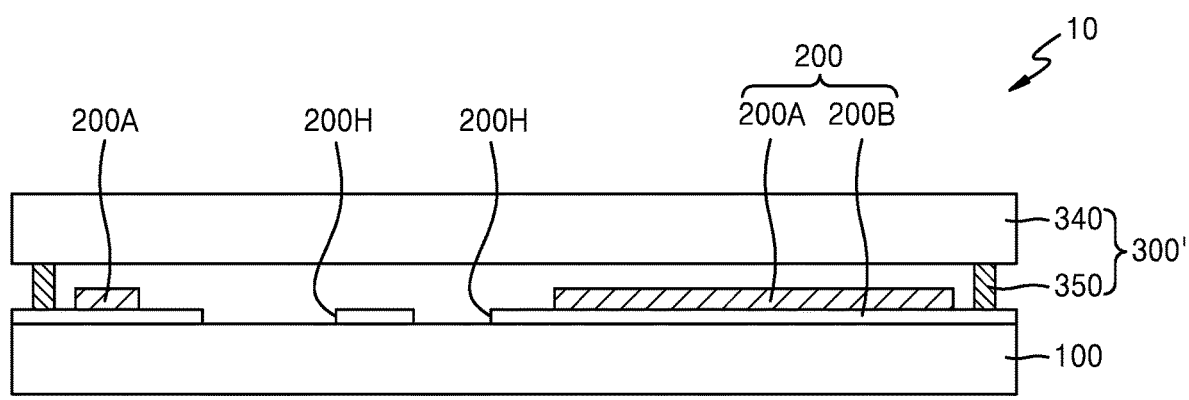
Figure 4B:
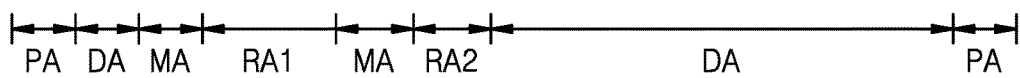
Figure 4B:
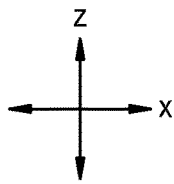

FIGS. 4A and 4B are each a cross-sectional view of the display panel 10 according to an embodiment.

Referring to FIGS. 4A and 4B, an encapsulation member 300' includes an encapsulation substrate 340. The encapsulation substrate 340 faces the substrate 100. The display layer 200 is arranged between the encapsulation substrate 340 and the substrate 100. A sealing material 350 is arranged between the encapsulation substrate 340 and the substrate 100. The sealing material 350 may surround a lateral surface (e.g., an edge or side surface) of the display layer 200. For example, in a plan view, the sealing material 350 may surround the display layer 200, for example, the display element layer 200A in the peripheral area PA and the intermediate area MA.

Although it is shown in FIG. 4A, which is a cross-sectional view, that the sealing materials 350 in the intermediate area MA are apart (e.g., spaced apart) from each other on two sides of the first hole 10H, the sealing materials 350 in the intermediate area MA may have a ring shape surrounding each of the first holes 10H in a plan view. The sealing material 350 arranged in the peripheral area PA may be apart (e.g., spaced apart) from the sealing material 350 arranged in the intermediate area MA. As shown in FIG. 4A, the first holes 10H may be respectively formed in the first region RA1 and the second region RA2, and each first hole 10H may be surrounded by the sealing material 350.

In another embodiment, as shown in FIG. 4B, the substrate 100 and the encapsulation substrate 340 may not include a through hole. The display layer 200 may include the through holes 200H respectively in the first region RA1 and the second region RA2 and secure a transmittance by which light may pass through the through holes 200H. For example, the through holes 200H of the display layer 200 may allow light to pass through the display panel 10. In the case where the first holes 10H are not formed in the first region RA1 and the second region RA2 in the substrate 100 and the encapsulation substrate 340, the sealing material 350 may only be in the peripheral area PA.

Figure 5A:
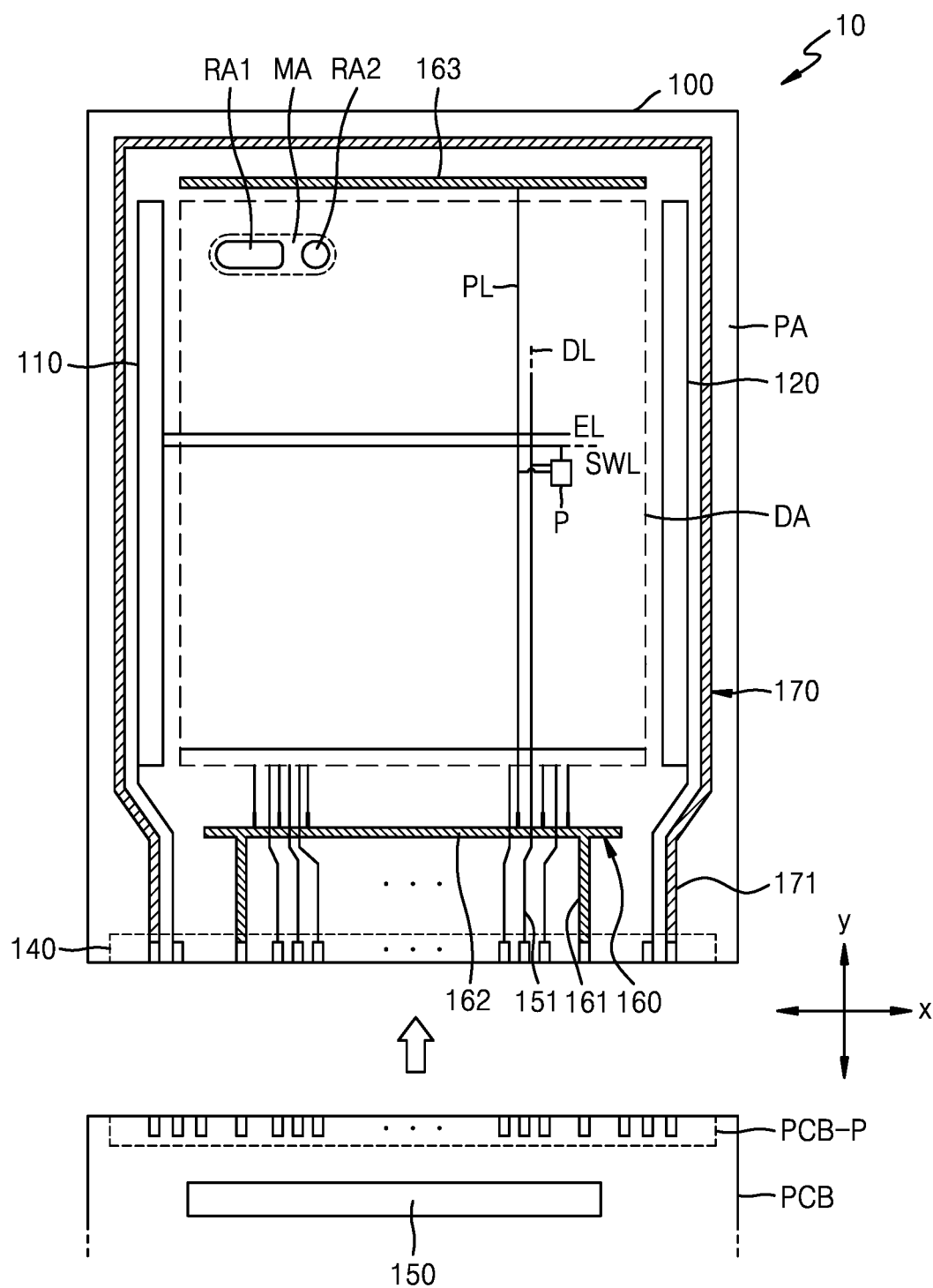
FIGS. 5A and 5B are each a plan view of a display panel according to an embodiment.
Figure 5B:
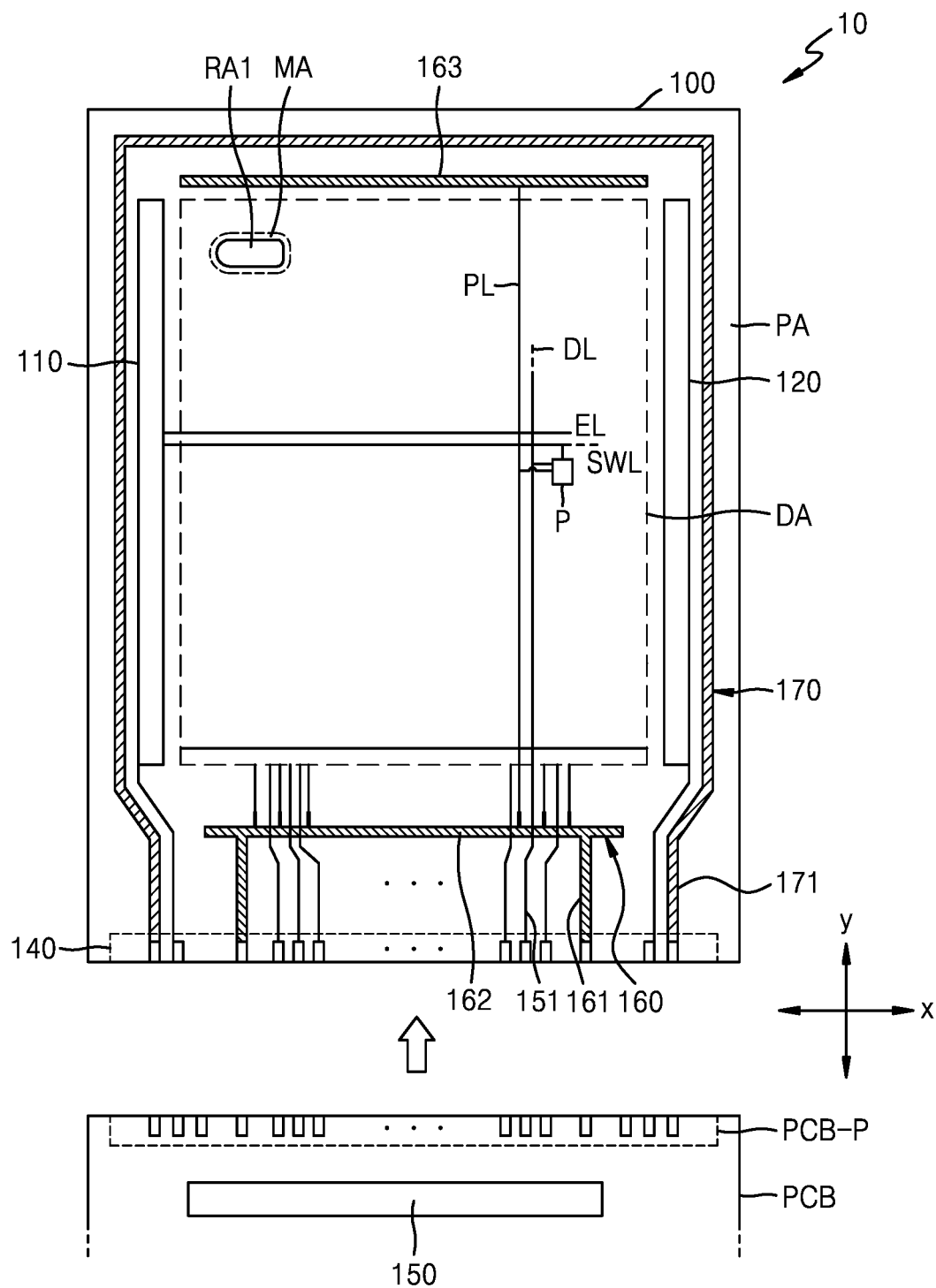

FIGS. 5A and 5B are each a plan view of the display panel 10 according to an embodiment.

Referring to FIGS. 5A and 5B, the display panel 10 may include at least one region in which a component may be arranged. For example, as shown in FIG. 5A, the display panel 10 may include the first region RA1, the second region RA2, and the display area DA, or as shown in FIG. 5B, the display panel 10 may include the first region RA1.

In an embodiment, as described with reference to FIG. 2A, the display panel 10 may include the first holes 10H corresponding to the first region RA1 and the second region RA2. In this case, the first region RA1 or the second region RA2 shown in FIGS. 5A and 5B may correspond to a planar shape of the first hole 10H (see FIG. 2A) of the display panel 10. In another embodiment, as described above with reference to FIG. 2C, the display panel 10 does not include the first holes 10H respectively corresponding to the first region RA1 and the second region RA2.

Referring to FIG. 5A, the display panel 10 may include the first region RA1, the second region RA2, the display area DA, the intermediate area MA, and the peripheral area PA. FIG. 5A may show a figure of the substrate 100 of the display panel 10. For example, the substrate 100 may include a plurality of regions corresponding to the first region RA1, the second region RA2, the display area DA, the intermediate area MA, and the peripheral area PA. Referring to FIG. 5B, the display panel 10 may include the first region RA1, the display area DA, the intermediate area MA, and the peripheral area PA. The substrate 100 may include regions respectively corresponding to the first region RA1, the display area DA, the intermediate area MA, and the peripheral area PA.

Each of the plurality of pixels P arranged in the display area DA may include a display element such as an organic light-emitting diode. Each pixel P may emit, for example, red, green, or blue light from an organic light-emitting diode. The first region RA1 and the second region RA2 may be arranged inside the display area DA (FIG. 5A), or the first region RA1 may be arranged inside the display area DA (FIG. 5B). The intermediate area MA may be arranged between the first and second regions RA1 and RA2 and the display area DA, or between the first region RA1 and the display area DA.

The intermediate area MA is a kind of non-display area. Signal lines may be arranged in the intermediate area MA, and the signal lines may provide a signal to pixels P arranged around the intermediate area MA.

A first outer driving circuit 110, a second outer driving circuit 120, a terminal 140, a data driving circuit 150, a first power supply line 160, and a second power supply line 170 may be arranged in the peripheral area PA.

The first outer driving circuit 110 may include a scan and control driving circuit. The first outer driving circuit 110 may provide a scan signal and an emission control signal to each pixel P through a scan line SWL and an emission control line EL, respectively. The second outer driving circuit 120 may include a scan and control driving circuit. The second outer driving circuit 120 may be arranged in parallel (e.g., substantially in parallel) to the first outer driving circuit 110 with the display area DA therebetween. Like the first outer driving circuit 110, the second outer driving circuit 120 may provide a scan signal and an emission control signal to each pixel P through the scan line SWL and the emission control line EL, respectively.

The terminal 140 may be arranged at (e.g., on) a side of a peripheral area PA (e.g., a different side of the peripheral area PA than that of the first outer driving circuit 110 and the second outer driving circuit 120). The terminal 140 may be exposed and electrically connected to a printed circuit board PCB by not being covered by an insulating layer. A terminal PCB-P of the printed circuit board PCB may be electrically connected to the terminal 140 of the display panel 10. The printed circuit board PCB is configured to transfer a signal of a controller and/or power to the display panel 10. Control signals generated by the controller may be respectively transferred to the first and second outer driving circuits 110 and 120 through the printed circuit board PCB. The controller may respectively provide first and second power voltages ELVDD and ELVSS (see FIG. 6, described below) to the first and second power supply lines 160 and 170 through first and second connection lines 161 and 171. The first power voltage ELVDD may be provided to each pixel P through a driving voltage line PL connected to the first power supply line 160, and the second power voltage ELVSS may be provided to an opposite electrode of a pixel P connected to the second power supply line 170.

The data driving circuit 150 may be electrically connected to a data line DL. A data signal of the data driving circuit 150 may be provided to each pixel P through a connection line 151 and the data line DL, the connection line 151 being connected to the terminal 140, and the data line DL being connected to the connection line 151. Although it is shown in FIG. 5 that the data driving circuit 150 is arranged on the printed circuit board PCB, the data driving circuit 150 may be arranged on the substrate 100 in another embodiment. For example, the data driving circuit 150 may be arranged between the terminal 140 and the first power supply line 160.

The first power supply line 160 may include a first sub-line 162 and a second sub-line 163 that are parallel (e.g., substantially parallel) to each other with the display area DA therebetween and extending in an x-direction. The second power supply line 170 may have a loop shape having one open side and partially surrounding the display area DA. For example, the second power supply line 170 may surround the display area on three sides of a rectangular or square shape.

Figure 6:
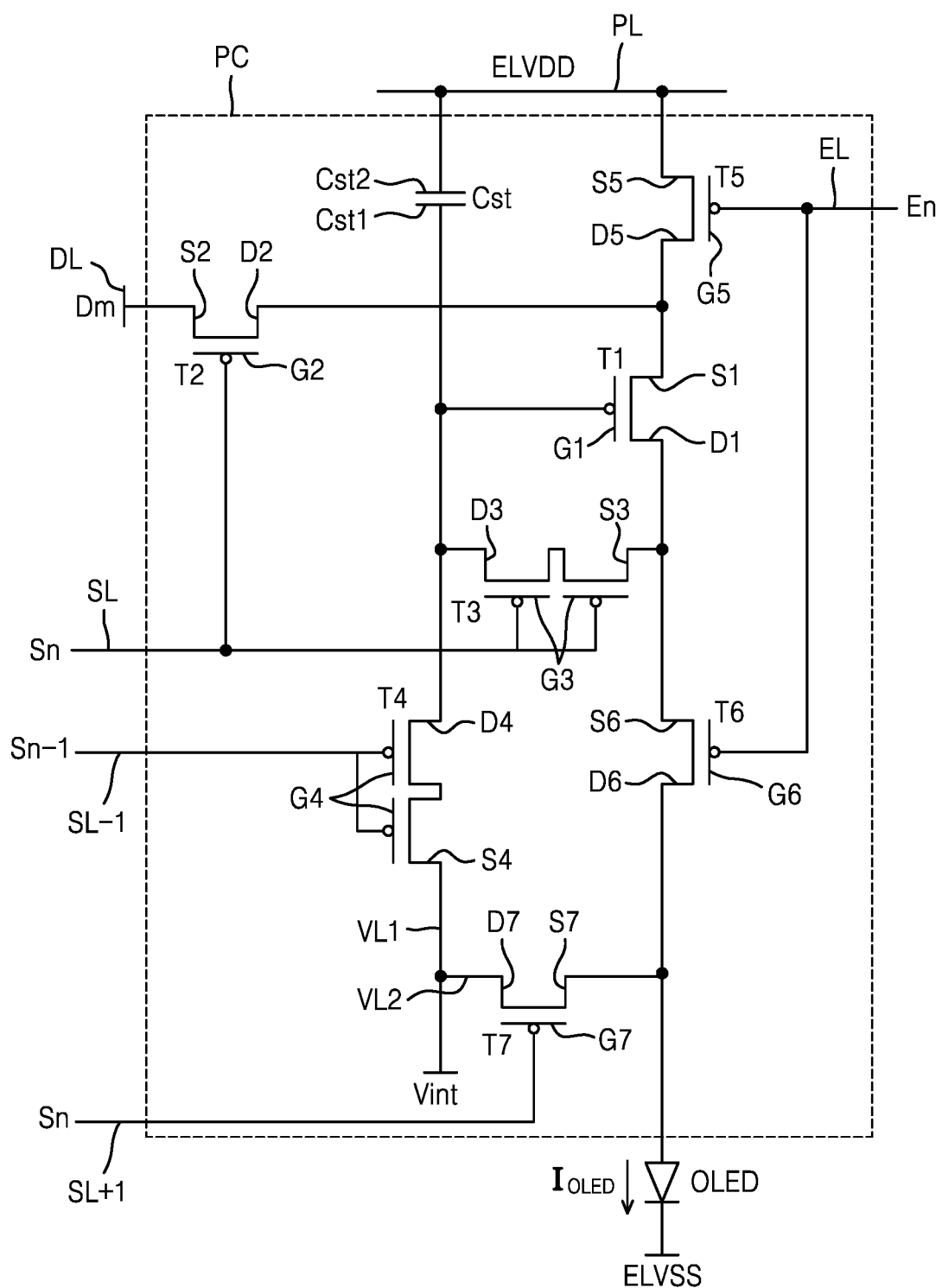
FIG. 6 is an equivalent circuit diagram of a pixel circuit electrically connected to an organic light-emitting diode of a display panel according to an embodiment.

FIG. 6 is an equivalent circuit diagram of a pixel circuit PC electrically connected to an organic light-emitting diode OLED of the display panel 10 according to an embodiment.

Referring to FIG. 6, the organic light-emitting diode OLED may be connected to the pixel circuit PC, and the pixel circuit PC may include a plurality of thin film transistors and a storage capacitor. The thin film transistors and the storage capacitor may be connected to signal lines SL, SL−1, SL+1, EL, and DL, a first initialization voltage line VL1, a second initialization voltage line VL2, and the driving voltage line PL.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, the previous scan line SL−1, the next scan line SL+1, the emission control line EL, and the data line DL, the scan line SL being configured to transfer a scan signal Sn (e.g., to the switching thin film transistor T2 and/or to the compensation thin film transistor T3), the previous scan line SL−1 being configured to transfer a previous scan signal Sn−1 to the first initialization thin film transistor T4, the next scan line SL+1 being configured to transfer a scan signal Sn to the second initialization thin film transistor T7, the emission control line EL being configured to transfer an emission control signal En to the operation control thin film transistor T5 and to the emission control thin film transistor T6, and the data line DL intersecting or crossing the scan line SL in the display panel and being configured to transfer a data signal Dm. The driving voltage line PL may be configured to transfer the first power voltage ELVDD to the driving thin film transistor T1, the first initialization voltage line VL1 may be configured to transfer an initialization voltage Vint to the first initialization thin film transistor T4, and the second initialization voltage line VL2 may be configured to transfer the initialization voltage Vint to the second initialization thin film transistor T7.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of the organic light-emitting diode OLED through the emission control thin film transistor T6. The driving thin film transistor T1 is configured to receive a data signal Dm, depending on (e.g., according to) a switching operation of a switching thin film transistor T2, and to supply a driving current IDLED to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and also connected to the driving voltage line PL through the operation control thin film transistor T5. The switching thin film transistor T2 is turned on in response to a scan signal Sn transferred through the scan line SL and is configured to perform a switching operation to transfer a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and also connected to the pixel electrode of the organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and is configured to diode-connect the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to the first initialization voltage line VL1, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and is configured to perform an initialization operation to initialize a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and to the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and to the compensation source electrode S3 of the compensation thin film transistor T3, and an emission control drain electrode D6 of the emission control thin film transistor T6 is connected to the second initialization source electrode S7 of the second initialization thin film transistor T7 and to the pixel electrode of the organic light-emitting diode OLED.

The operation control thin film transistor T5 and the emission control thin film transistor T6 are concurrently or simultaneously turned on in response to an emission control signal En transferred through the emission control line EL to allow the first power voltage ELVDD to be transferred to the organic light-emitting diode OLED and thus the driving current IDLED to flow through the organic light-emitting diode OLED.

A second initialization gate electrode G7 of the second initialization thin film transistor T7 is connected to the next scan line SL+1, the second initialization source electrode S7 of the second initialization thin film transistor T7 is connected to the emission control drain electrode D6 of the emission control thin film transistor T6 and to the pixel electrode of the organic light-emitting diode OLED, and the second initialization drain electrode D7 of the second initialization thin film transistor T7 is connected to the first initialization source electrode S4 of the first initialization thin film transistor T4 and to the second initialization voltage line VL2.

Because the scan line SL is electrically connected to the next scan line SL+1, the same scan signal Sn may be applied to the scan line SL and the next scan line SL+1. Therefore, the second initialization thin film transistor T7 may initialize the pixel electrode of the organic light-emitting diode OLED by being turned on in response to a scan signal Sn transferred through the next scan line SL+1.

A second storage capacitor plate Cst2 of the storage capacitor Cst is connected to the driving voltage line PL, and the opposite electrode of the organic light-emitting diode OLED is connected to the second power voltage ELVSS. Therefore, the organic light-emitting diode OLED may be configured to receive the driving current IDLED from the driving thin film transistor T1 and to emit light to thereby display an image.

Although it is shown in FIG. 6 that the compensation thin film transistor T3 and the first initialization thin film transistor T4 each have a dual gate electrode, the compensation thin film transistor T3 and the first initialization thin film transistor T4 each may have one gate electrode.

Although it is shown in FIG. 6 that the pixel circuit PC includes seven thin film transistors and one storage capacitor, embodiments of the present disclosure are not limited thereto. The number of thin film transistors may be six or less, or eight or more, the number of storage capacitors may be 2 or more, or may be omitted, and the number of thin film transistors and storage capacitors may be variously and suitably changed (e.g., set) depending on the design of the pixel circuit PC.

Figure 7:
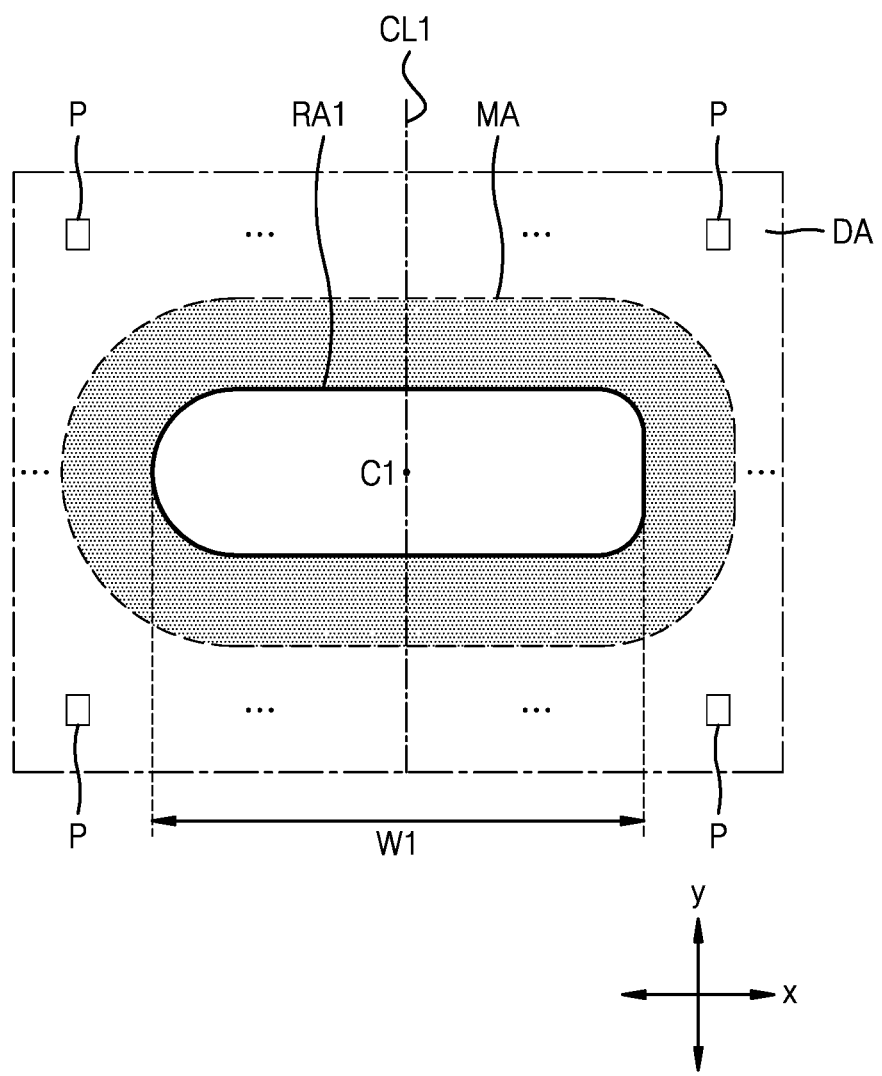
FIG. 7 is a plan view of a portion of a display panel according to an embodiment.

FIG. 7 is a plan view of a portion of the display panel 10 according to an embodiment.

Referring to FIG. 7, the display panel 10 may include the first region RA1 arranged inside the display area DA in which pixels P are arranged. In an embodiment, as described with reference to FIG. 2A, the display panel 10 may include the first hole 10H (see FIG. 2A) arranged in the first region RA1. In this case, the first region RA1 shown in FIG. 7 may have the planar shape of (e.g., corresponding to) the first hole 10H.

The first region RA1 may have a first width W1 in an x-direction and two sides of the first region RA1 may have an asymmetric shape with respect to a first central line CL1 passing through a first center C1 and dividing the first width W1 in half. The first central line CL1 may be a virtual line. In some embodiments, the first central line CL1 may extend in the y-direction to pass through the first center C1. In an embodiment, the right side of the first central line CL1 (e.g., a right side of the first region RA1 on the right side of the first central line CL1) may have an approximately (or substantially) quadrangular shape, and the left side of the first central line CL1 (e.g., a left side of the first region RA1 on the left side of the first central line CL1) may have an approximately (or substantially) semi-elliptical shape.

The intermediate area MA may have substantially the same shape as that of the first region RA1. For example, the intermediate area MA may have a shape in which two sides thereof are asymmetric with respect to the first central line CL1. In an embodiment, the intermediate area MA may have a planar shape different from that of the first region RA1. For example, the intermediate area MA may have a shape in which two sides thereof are symmetric (e.g., substantially symmetric) with respect to the first central line CL1. As disclosed herein, when two components or regions are said to be symmetric or asymmetric, the two components or regions may, for example, have reflective symmetry or reflective asymmetry, respectively.

Figure 8:
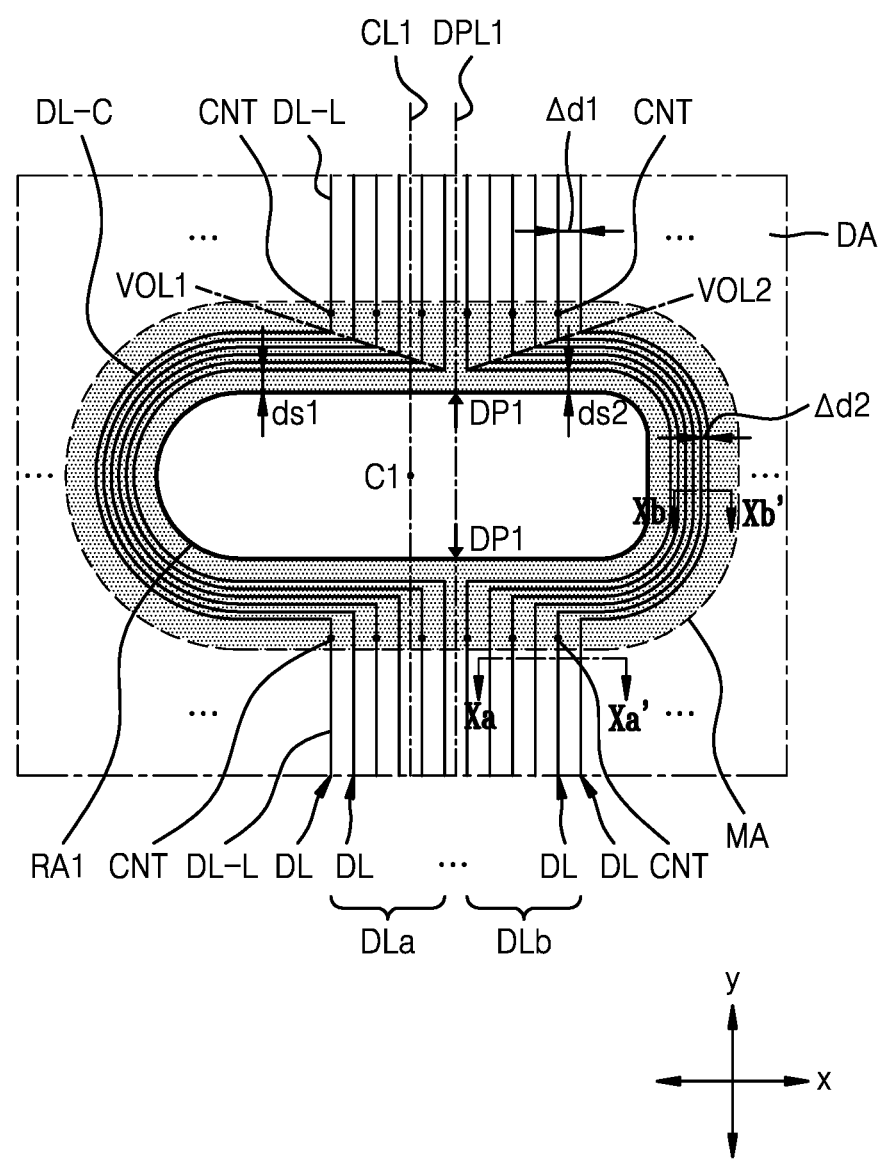
FIG. 8 is a plan view of signal lines arranged around a first region according to an embodiment.
Figure 9A:
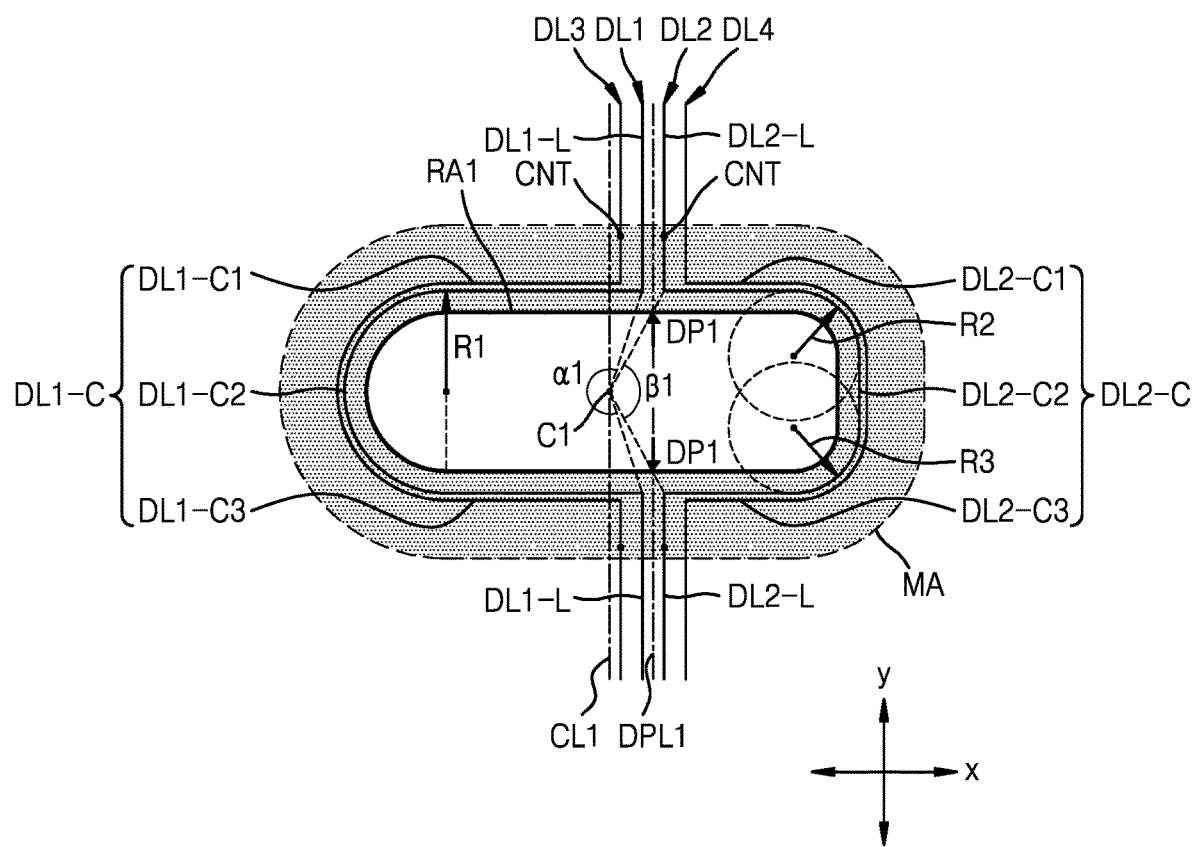
FIG. 9A is a plan view of four signal lines that neighbor each other among the signal lines of FIG. 8.
Figure 9B:
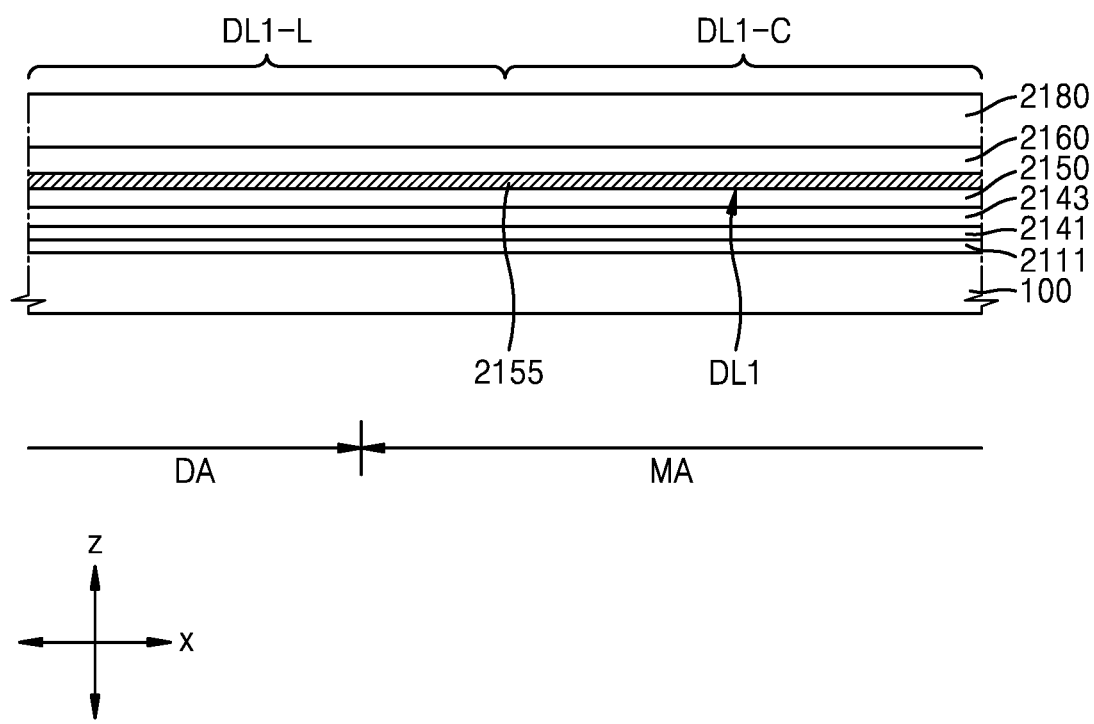
FIGS. 9B and 9C are each a cross-sectional view of one of the signal lines of FIG. 9A.
Figure 9C:
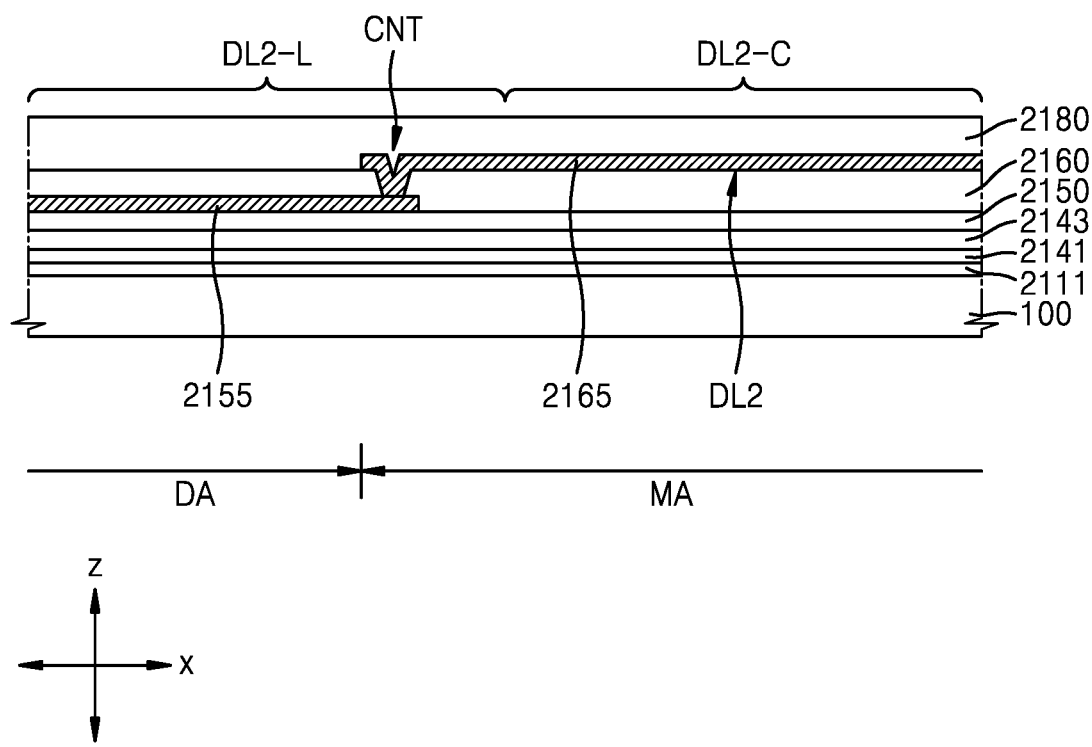
Figure 10:
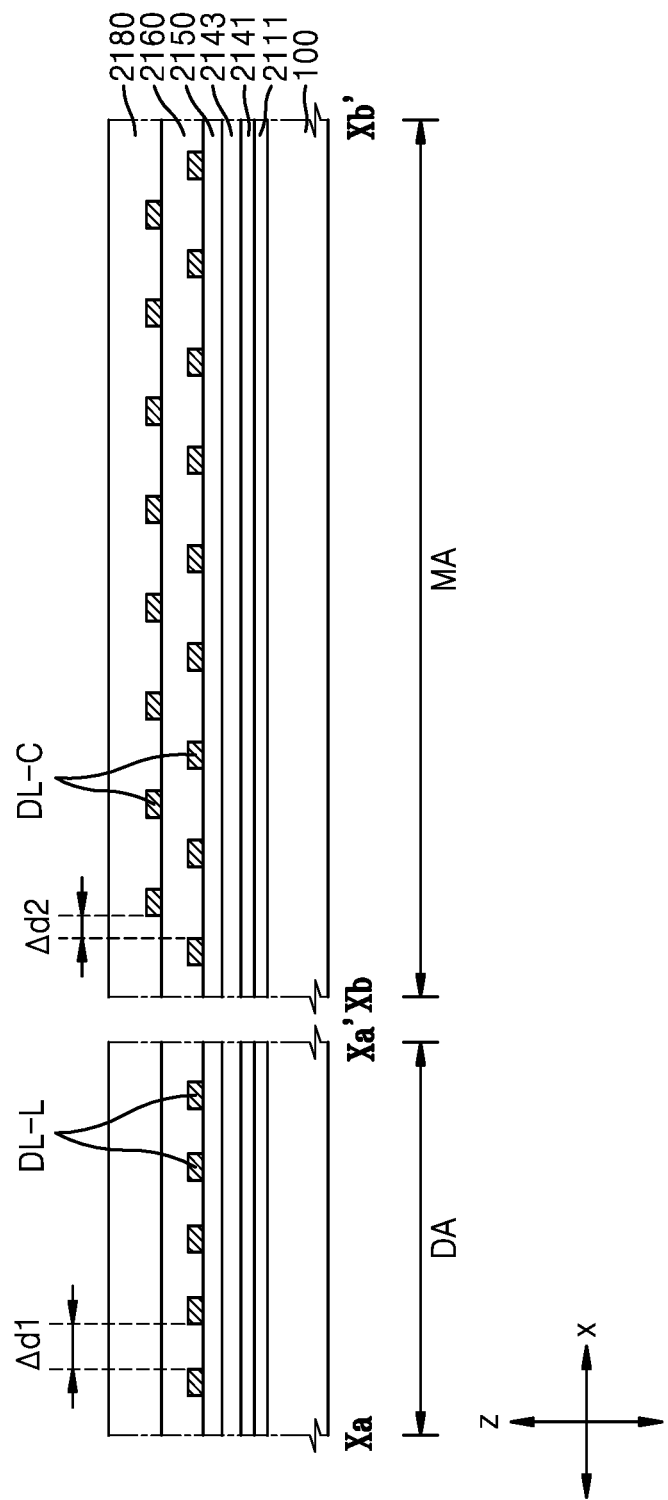
FIG. 10 is a cross-sectional view of a signal line taken along lines Xa-Xa' and Xb-Xb' of FIG. 8.

FIG. 8 is a plan view of signal lines arranged around the first region RA1 according to an embodiment, FIG. 9A is a plan view of four signal lines that neighbor each other among the signal lines of FIG. 8, FIGS. 9B and 9C are each a cross-sectional view of one of the signal lines of FIG. 9A, and FIG. 10 is a cross-sectional view of a signal line taken along line Xa-Xa' and Xb-Xb' of FIG. 8. FIGS. 8 to 9C show an embodiment where signal lines extending in one direction include data lines DL.

Referring to FIG. 8, the data lines DL may extend in one direction (e.g., a y-direction). When the data lines DL are referred to as extending in one direction (e.g., the y-direction), the data lines DL entirely (e.g., generally, ultimately, etc.) extend in one direction (e.g., the y-direction). For example, the data lines DL may extend in one direction (e.g., the y-direction), and a portion of each data line DL may detour around the first region RA1. For example, each data line DL may follow a curved path around the first region RA1.

In a plan view of FIG. 8, each data line DL extends in a y-direction to provide a signal to pixels arranged above and below the first region RA1 and may detour in the intermediate area MA. For example, each data line DL may include extension portions DL-L and a detouring portion DL-C, the extension portions DL-L being arranged on two opposite sides of the first region RA1 with the first region RA1 therebetween, and the detouring portion DL-C connecting the extension portions DL-L. Most of the extension portions DL-L may be located in the display area DA, and some (e.g., the remainder) of the extension portions DL-L may be located in the intermediate area MA. The detouring portion DL-C may be located in the intermediate area MA.

A first pitch Δd1 (or a first interval, for example, a distance interval) between portions of the data lines DL located in the display area DA may be greater than a second pitch Δd2 (or a second interval, for example, a distance interval) between portions of the data lines DL in the intermediate area MA. For example, the first pitch Δd1 between the extension portions of the data lines DL may be greater than the second pitch Δd2 between the detouring portions DL-C of the data lines DL. Because the pitch between the data lines DL in the intermediate area MA is relatively small, an area of the intermediate area MA, for example, an area of a dead area, may be reduced.

The data lines DL may include a first group DLa including the data lines that detour around one side (e.g., the left of the first region RA1 in FIG. 8) of the first region RA1 and a second group DLb including the data lines that detour around another side (e.g., the right of the first region RA1 in FIG. 8) of the first region RA1.

The data lines DL of the first group DLa and the data lines DL of the second group DLb may respectively extend in different directions from a first division point DP1. The data lines DL of the first group DLa may extend along the left of the first region RA1 from (e.g., away from) the first division point DP1, and the data lines DL of the second group DLb may extend along the right of the first region RA1 from (e.g., away from) the first division point DP1.

The data lines DL of the first group DLa may extend along the edge of the first region RA1 and maintain a first distance ds1 from the edge of the first region RA1. In an embodiment, the first distance ds1 may have a constant value, and the detouring portion of the data lines DL of the first group DLa may be apart (e.g., spaced apart) from the first region RA1 with a constant interval (e.g., by a constant distance interval). In some embodiments, the portion of an innermost data line from the first group DLa that extends along the edge of the first region RA1 may be spaced apart from the edge of the first region RA1 by the first distance ds1, and the portion of each of the other data lines of the first group DLa that extends along the edge of the first region RA1 may be spaced apart from the edge of the first region RA1 by a distance greater than the first distance ds1.

Similarly, the data lines DL of the second group DLb may extend along the edge of the first region RA1 and maintain a second distance ds2 from the edge of the first region RA1. In an embodiment, the second distance ds2 may have a constant value, and the detouring portion of the data lines DL of the second group DLb may be apart (e.g., spaced apart) from the edge of the first region RA1 with a constant interval (e.g., by a constant distance interval). The second distance ds2 may have the same value as that of the first distance ds1. In some embodiments, the portion of an innermost data line from the second group DLb that extends along the edge of the second region RA2 may be spaced apart from the edge of the second region RA2 by the second distance ds2, and the portion of each of the other data lines of the second group DLb that extends along the edge of the second region RA2 may be spaced apart from the edge of the second region RA2 by a distance greater than the second distance ds2.

In some embodiments, the first division point DP1 is not located on the same line as the first central line CL1. For example, as shown in FIG. 8, the first division point DP1 may be located on a first virtual line DPL1 apart (e.g., spaced apart) from the first central line CL1 by a predetermined or set interval (e.g., distance interval) in a direction (e.g., an x-direction) intersecting or crossing an extension direction of a data line (e.g., a y-direction).

In a plan view, the data lines DL of the first group DLa and the data lines DL of the second group DLb may have shapes asymmetric to each other. For example, the detouring portion DL-C of each of the data lines DL of the first group DLa and the detouring portion DL-C of each of the data lines DL of the second group DLb may have an asymmetric shape. In an embodiment, in a plan view, the detouring portion DL-C of each of the data lines DL of the first group DLa may have a shape similar to that of a portion of the edge of the first region RA1, for example, a semi-elliptical shape as a whole (e.g., a substantially semi-elliptical shape). In a plan view, the detouring portion DL-C of each of the data lines DL of the second group DLb may have a shape similar to that a portion of the edge of the first region RA1, for example, a quadrangular shape as a whole (e.g., a substantially quadrangular shape).

A connection point between the extension portion DL-L and the detouring portion DL-C of each of the data lines DL of the first group DLa may be arranged in an oblique direction that is oblique with respect to the x-direction and the y-direction. A connection point between the extension portion DL-L and the detouring portion DL-C of each of the data lines DL of the first group DLa may be placed on a first virtual oblique line VOL1 that is oblique with respect to the x-direction and the y-direction. Similarly, a connection point between the extension portion DL-L and the detouring portion DL-C of each of the data lines DL of the second group DLb may be arranged in an oblique direction that is oblique with respect to the x-direction and the y-direction. A connection point between the extension portion DL-L and the detouring portion DL-C of each of the data lines DL of the second group DLb may be placed on a second virtual oblique line VOL2 that is oblique with respect to the x-direction and the y-direction. A connection point between the extension portion DL-L and the detouring portion DL-C of each data line DL may correspond to an end portion of the detouring portion DL-C.

Referring to FIG. 9A, a first data line DL1 and a second data line DL2 may respectively extend in opposite directions from (e.g., away from) the first division point DP1. A detouring portion DL1-C of the first data line DL1 may be located at (e.g., on) one side of the first region RA1, for example, at (e.g., on) the left side of the first region RA1 and may extend along a portion of the first region RA1. A detouring portion DL2-C of the second data line DL2 may be located at (e.g., on) another side of the first region RA1, for example, at (e.g., on) the right side of the first region RA1, and may extend along another portion of the first region RA1.

The first data line DL1 may include extension portions DL1-L and the detouring portion DL1-C, each of the extension portions DL1-L passing across the display area DA and the detouring portion DL1-C connecting the extension portions DL1-L and being located in the intermediate area MA. The detouring portion DL1-C of the first data line DL1 may have substantially the same shape as that of a portion (e.g., a left portion) of the first region RA1. For example, in a plan view, the detouring portion DL1-C of the first data line DL1 may have a substantially semi-elliptical shape.

The detouring portion DL1-C of the first data line DL1 may include a first detouring portion DL1-C1, a third detouring portion DL1-C3, and a second detouring portion DL1-C2 between the first detouring portion DL1-C1 and the third detouring portion DL1-C3. Each of the first detouring portion DL1-C1 and the third detouring portion DL1-C3 may be connected to the extension portions DL1-L (e.g., each of the first detouring portion DL1-C1 and the third detouring portion DL1-C3 may be connected to a respective one of the extension portions DL1-L) and extend in a direction (e.g., the x-direction) different from (e.g., perpendicular or substantially perpendicular to) that of the extension portion DL1-L.

The first detouring portion DL1-C1 and the third detouring portion DL1-C3 may be substantially straight lines, and the second detouring portion DL1-C2 may include a curved line. For example, the second detouring portion DL1-C2 may have a substantially semi-circular shape having a radius R1 in a plan view.

The second data line DL2 may include extension portions DL2-L and a detouring portion DL2-C, the extension portions DL2-L passing across the display area DA, and the detouring portion DL2-C connecting the extension portions DL2-L and being located in the intermediate area MA. The detouring portion DL2-C of the second data line DL2 may have substantially the same shape as that of a portion (e.g., a right portion) of the first region RA1. For example, in a plan view, the detouring portion DL2-C of the second data line DL2 may have a substantially quadrangular shape, for example, a quadrangular shape having round corners.

The detouring portion DL2-C of the second data line DL2 may include a first detouring portion DL2-C1, a third detouring portion DL2-C3, and a second detouring portion DL2-C2 between the first detouring portion DL2-C1 and the third detouring portion DL2-C3. Each of the first detouring portion DL2-C1 and the third detouring portion DL2-C3 may be connected to the extension portions DL2-L (e.g., each of the first detouring portion DL2-C1 and the third detouring portion DL2-C3 may be connected to a respective one of the extension portions DL2-L) and extend in a direction (e.g., the x-direction) different from (e.g., perpendicular or substantially perpendicular to) that of the extension portion DL2-L.

The first to third detouring portions DL2-C1, DL2-C2, and DL2-C3 of the second data line DL2 may be substantially straight lines. A connection portion between the first detouring portion DL2-C1 and the second detouring portion DL2-C2 of the second data line DL2 may include a curved line, and a connection portion between the third detouring portion DL2-C3 and the second detouring portion DL2-C2 of the second data line DL2 may include a curved line. For example, in a plan view, the connection portion between the first detouring portion DL2-C1 and the second detouring portion DL2-C2 of the second data line DL2 may have an arc shape having a radius R2 in a plan view, and the connection portion between the third detouring portion DL2-C3 and the second detouring portion DL2-C2 of the second data line DL2 may have an arc shape having a radius R3 in a plan view. The radius R2 and the radius R3 may be equal to or different from each other.

The first division point DP1 may be located in the first virtual line DPL1 apart (e.g., spaced apart) in the x-direction from the first central line CL1. Therefore, a central angle α1 of the detouring portion DL1-C of the first data line DL1 may be different from a central angle β1 of the detouring portion DL2-C of the second data line DL2. The central angle represents an angle formed by a virtual arc connecting a first center C1 and two opposite ends of the detouring portion DL-C of each data line DL that detours the first region RA1. In an embodiment, the central angle α1 of the detouring portion DL1-C of the first data line DL1 may be greater than the central angle β1 of the detouring portion DL2-C of the second data line DL2.

A length of the detouring portion DL1-C of the first data line DL1 may be the same or substantially the same as a length of the detouring portion DL2-C of the second data line DL2. When the length of the detouring portion DL1-C of the first data line DL1 is referred to as being the same or substantially the same as the length of the detouring portion DL2-C of the second data line DL2, a length deviation therebetween may be within several μm. For example, a difference between the length of the detouring portion DL1-C of the first data line DL1 and the length of the detouring portion DL2-C of the second data line DL2 may be 80 μm or less, or 70 μm or less. In an embodiment, a difference between the length of the detouring portion DL1-C of the first data line DL1 and the length of the detouring portion DL2-C of the second data line DL2 may be in the range of about 0.1 μm to about 70 μm.

As a comparative example, in the case where the first division point CP1 is located on the first central line CL1, the length of the detouring portion DL1-C of the first data line DL1 may be different from the length of the detouring portion DL2-C of the second data line DL2. For example, a difference between the length of the detouring portion DL1-C of the first data line DL1 and the length of the detouring portion DL2-C of the second data line DL2 may be about one thousand μm to tens of thousands μm or more. Such length deviation causes a resistance deviation, and, because a brightness difference and/or a color deviation may be caused by a resistance deviation, an image quality of the display panel may be deteriorated.

In contrast, according to an embodiment, as described with reference to FIGS. 8 and 9A, the first division point DP1 between the first group DLa and the second group DLb may be located on the first virtual line DPL1 apart (e.g., spaced apart) from the first central line CL1. Therefore, the length of the detouring portion DL1-C of a data line of the first group DLa, for example, the first data line DL1, and the length of the detouring portion DL2-C of a data line of the second group DLb, for example, the second data line DL2, may be the same or substantially the same, and thus the brightness difference and/or the color deviation may be prevented, minimized, or reduced. For example, the distance between the first virtual line DPL1 and the central line CL1 may be predetermined or set so that the length of the detouring portion DL1-C of a data line of the first group DLa is the same or substantially the same as the length of the detouring portion DL2-C of a data line of the second group DLb.

A third data line DL3 and a fourth data line DL4 may be apart (e.g., spaced apart) from each other with the first and second data lines DL1 and DL2 therebetween. The third data line DL3 may be located on the opposite side of the second data line DL2 with the first data line DL1 therebetween, and the fourth data line DL4 may be located on the opposite side of the first data line DL1 with the second data line DL2 therebetween. For example, the third data line DL3, the first data line DL1, the second data line DL2, and the fourth data line DL4 may be arranged in this order from left to right along one direction (e.g., x-direction).

The third data line DL3 and the fourth data line DL4 may respectively extend in opposite directions from the first division point DP1. A detouring portion of the third data line DL3 may be located on one side of the first region RA1, for example, on the left side of the first region RA1 and may extend along a portion of the first region RA1, and a detouring portion of the fourth data line DL4 may be located on another side of the first region RA1, for example, on the right side of the first region RA1 and may extend along a portion of the first region RA1.

The third data line DL3 may have substantially the same characteristic (e.g., shape, length, etc.) as that of the first data line DL1, and the fourth data line DL4 may have substantially the same characteristic (e.g., shape, length, etc.) as that of the second data line DL2. For example, the third data line DL3 and the fourth data line DL4 may have asymmetric shapes and/or may have different central angles of the detouring portions. The third data line DL3 and the fourth data line DL4 may include all of the characteristics of the first data line DL1 and the second data line DL2, respectively.

The connection point between the extension portion and the detouring portion of the third data line DL3 and the connection point between the extension portion and the detouring portion of the first data line DL1 may be placed (e.g., located) on the first oblique line VOL1 as described with reference to FIG. 8. Similarly, the connection point between the extension portion and the detouring portion of the fourth data line DL4 and the connection point between the extension portion and the detouring portion of the second data line DL2 may be placed (e.g., located) on the second oblique line VOL2 as described with reference to FIG. 8.

Some of the data lines DL of the first group DLa and the second group DLb may include a conductive layer including one body, and others of the data lines DL may include conductive lines located on different layers.

As shown in FIG. 9B, the first data line DL1 may include a first conductive layer 2155 on a fourth insulating layer 2150. The extension portion DL1-L and the detouring portion DL1-C of the first data line DL1 may be formed as one body. It is shown in FIG. 9B that first to third insulating layers 2111, 2141, and 2143 are arranged between the substrate 100 and the fourth insulating layer 2150, and a fifth insulating layer 2160 and a sixth insulating layer 2180 are formed on the first data line DL1.

In contrast, as shown in FIG. 9C, the second data line DL2 may include a connection structure in which the first conductive layer 2155 on the fourth insulating layer 2150 is connected to a second conductive layer 2165 on the fifth insulating layer 2160. Most of the extension portion of the second data line DL2 may include the first conductive layer 2155, and the detouring portion DL2-C may include the second conductive layer 2165. The first conductive layer 2155 may be connected to the second conductive layer 2165 through a contact hole CNT of (e.g., in) the fifth insulating layer 2160 therebetween.

The first conductive layer 2155 and the second conductive layer 2165 may include (e.g., be) a conductive material including molybdenum (Mo), aluminum (Al), copper (Cu), and/or titanium (Ti) and may include (e.g., be) a single layer or a multi-layer structure including the above materials. In an embodiment, the first conductive layer 2155 and/or the second conductive layer 2165 may include (e.g., be) three sub-layers of Ti/Al/Ti. The first conductive layer 2155 and the second conductive layer 2165 may include (e.g., be) the same material. In some embodiments, the first conductive layer 2155 and the second conductive layer 2165 may include (e.g., be) different materials.

Referring to FIGS. 8 and 9A to 9C, one of neighboring data lines DL may have a structure shown in FIG. 9B, and another one of the neighboring data lines DL may have a structure shown in FIG. 9C. In some embodiments, the one neighboring data line DL and the other neighboring data line DL may be adjacent data lines DL. For example, one of the neighboring data lines DL may have a single body of the first conductive layer 2155 (e.g., as shown in FIG. 9B), and the other one of the neighboring data lines DL may have a connection structure of the first conductive layer 2155 and the second conductive layer 2165 arranged on different layers (e.g., as shown in FIG. 9C). Therefore, as shown in FIGS. 8 and 9A, contact holes CNT may be alternately arranged among the data lines DL in the x-direction. Moreover, as shown in FIG. 10, detouring portions of the data lines DL may be alternately arranged up and down with an insulating layer therebetween. As disclosed herein, when one line, component, or region is said to "neighbor" another line, component, or region, the one line, component, or region may, for example, be an adjacent, a nearby, or the nearest, line, component, or region to the other line, component, or region.

Referring to FIGS. 8 and 10, extension portions DL-L of the data lines DL may be arranged on the fourth insulating layer 2150 in the display area DA, but the detouring portions DL-C of the data line DL may be alternately arranged up and down with the fifth insulating layer 2160 therebetween in the intermediate area MA. For example, as shown in FIG. 10, one detouring portion DL-C of one data line may be on the fourth insulating layer 2150 and another detouring portion DL-C of another data line adjacent to the one data line may be on the fifth insulating layer 2160, and the fifth insulating layer 2160 may be between the one detouring portion DL-C and the other detouring portion DL-C. Because detouring portions DL-C that neighbor each other among the detouring portions DL-C of the data lines DL are arranged on different layers in the intermediate area MA, the second pitch Δd2 described above with reference to FIG. 8 may be less than the first pitch Δd1.

Figure 11:
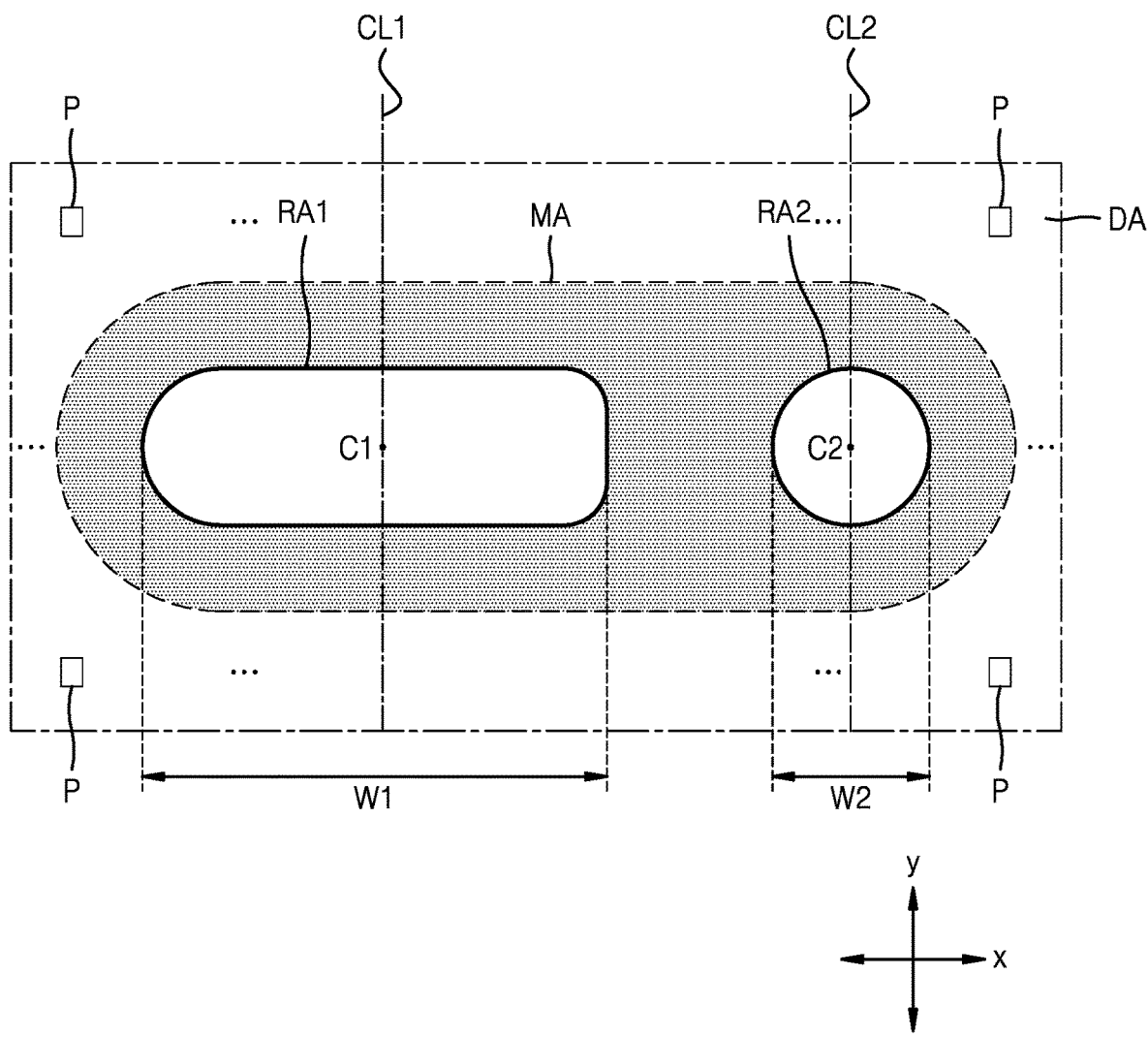
FIG. 11 is a plan view of a portion of a display panel according to an embodiment.

FIG. 11 is a plan view of a portion of the display panel 10 according to an embodiment.

Referring to FIG. 11, the display panel 10 may include the first region RA1 and the second region RA2 arranged inside the display area DA in which the pixels P are arranged. In an embodiment, as described with reference to FIG. 2A, the display panel 10 may include the first holes 10H (see FIG. 2A) arranged in the first region RA1 and the second region RA2. In this case, the first region RA1 and the second region RA2 shown in FIG. 11 may respectively have planar shapes of the first holes 10H corresponding thereto.

The first region RA1 and the second region RA2 may be apart (e.g., spaced apart) from each other in one direction (e.g., x-direction). In an embodiment, although it is shown in FIG. 11 that the first region RA1 and the second region RA2 are arranged in the x-direction, the first region RA1 and the second region RA2 may be arranged in the y-direction or may be arranged in a direction oblique with respect to the x-direction and the y-direction. Various suitable modifications may be made.

The first region RA1 and the second region RA2 may be surrounded by the intermediate area MA. Portions of the intermediate area MA may be respectively arranged between the first region RA1 and the display area DA, between the second region RA2 and the display area DA, and/or between the first region RA1 and the second region RA2.

As described above with reference to FIG. 7, the first region RA1 may have the first width W1 in the x-direction and have a shape in which two opposite sides (e.g., left and right sides) thereof are asymmetric with respect to the first central line CL1 passing through the first center C1 of the first width W1.

The second region RA2 may have a second width W2 in the x-direction and have a shape in which two opposite sides (e.g., left and right sides) thereof are symmetric with respect to the second central line CL2 passing through the second center C2 of the second width W2. For example, the second region RA2 may have a circular shape in which two opposite sides thereof are symmetric with respect to the second central line CL2 passing through the second center C2. In some embodiments, the second region RA2 may have a shape such as a quadrangular shape or an elliptical shape in which two opposite sides thereof are symmetric with respect to the second central line CL2 passing through the second center C2. In another embodiment, like the first region RA1, the second region RA2 may have a shape in which two opposite sides thereof are asymmetric with respect to the second central line CL2 passing through the second center C2.

Figure 12A:
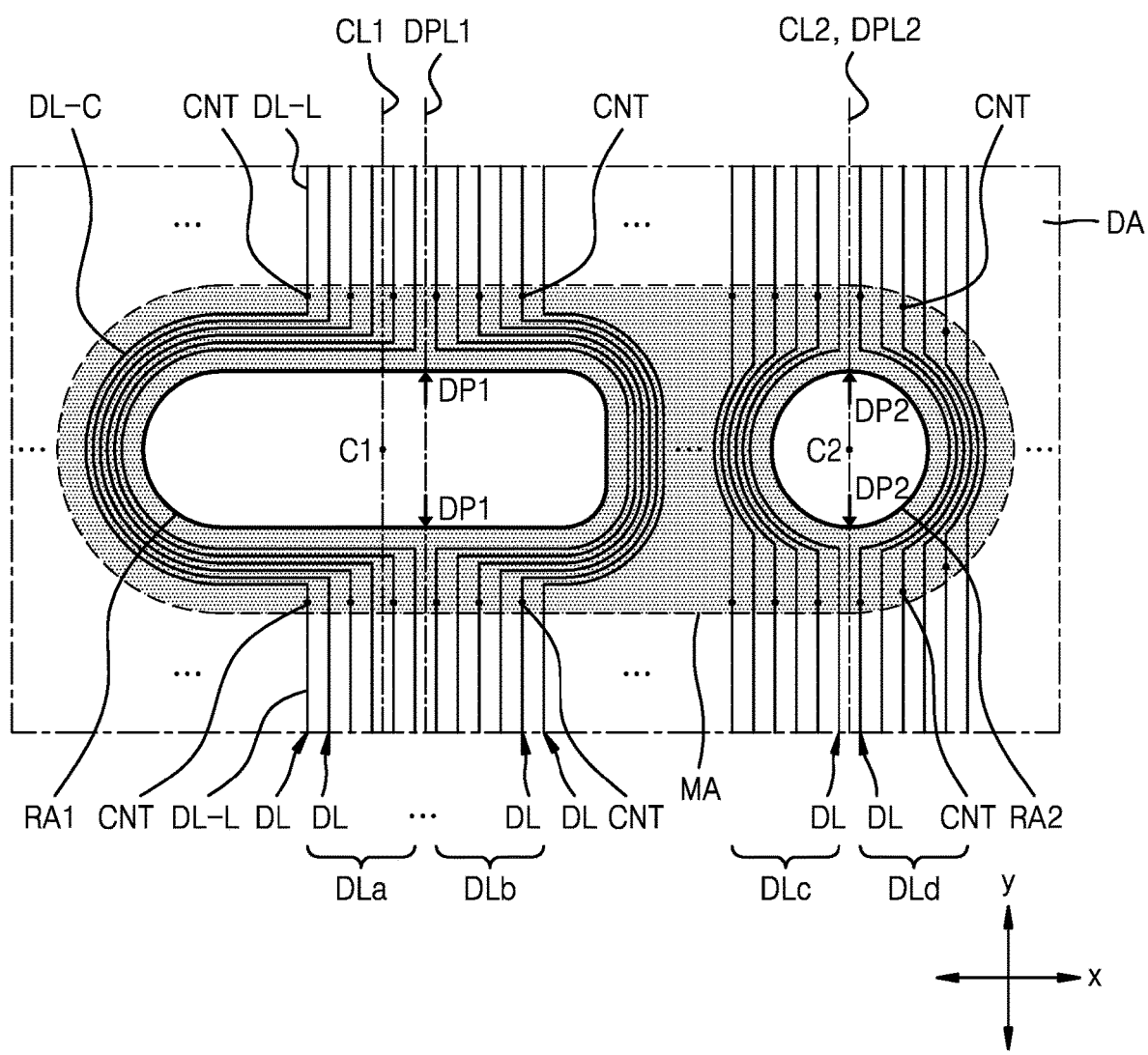
FIG. 12A is a plan view of signal lines arranged around a first region according to an embodiment.
Figure 12B:
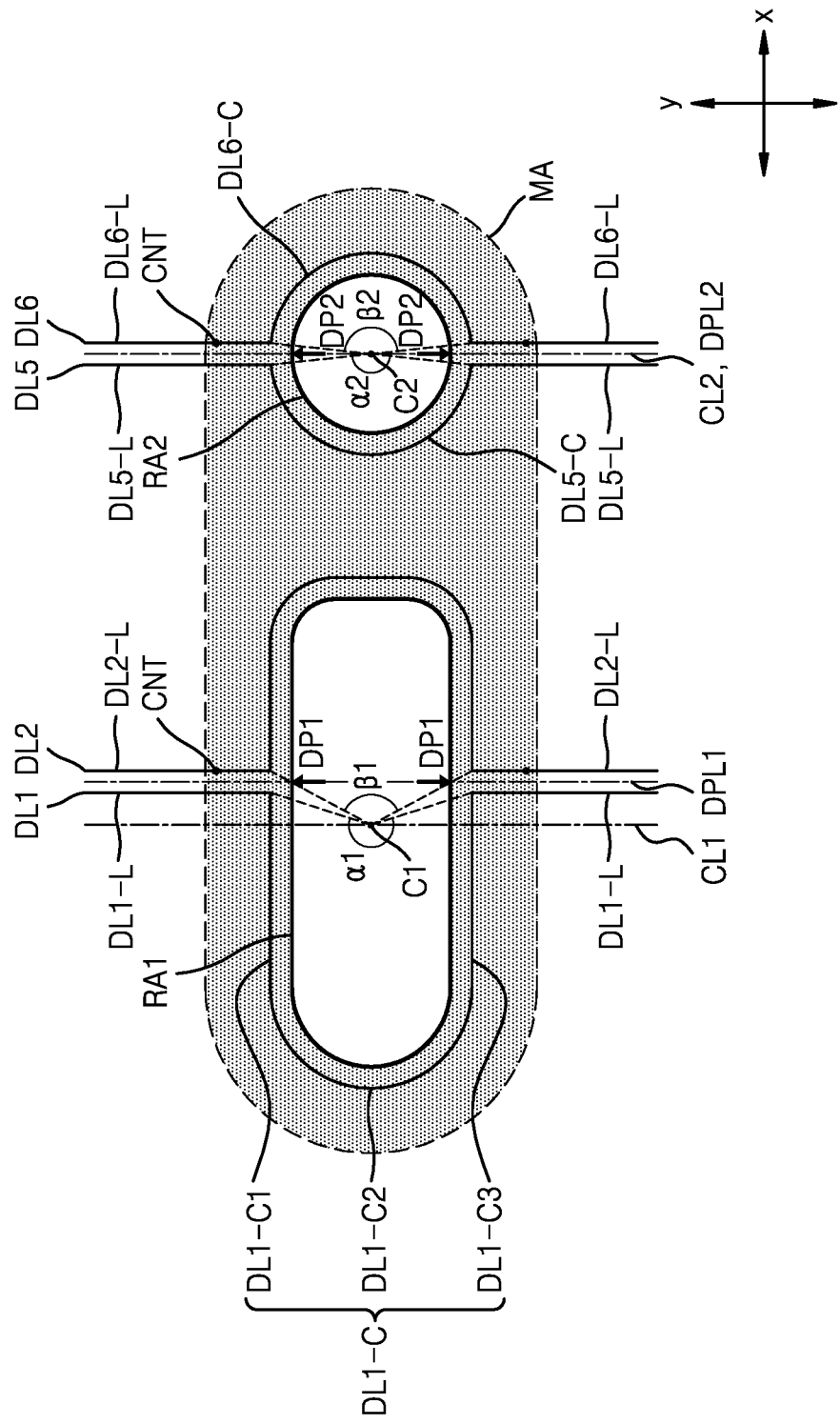
FIG. 12B is an extracted plan view of some of the signal lines of FIG. 12A.

FIG. 12A is a plan view of signal lines arranged around the first region RA1 according to an embodiment, and FIG. 12B is an extracted plan view of some of the signal lines of FIG. 12A. FIGS. 12A and 12B show cases where the signal lines include the data lines DL.

Referring to FIG. 12A, the data lines DL may extend in the y-direction, some of the data lines DL may detour around the first region RA1 in the intermediate area MA, and some of the data lines DL may detour around the second region RA2 in the intermediate area MA.

Because the characteristics (e.g., shape, length, etc.) of the data lines DL arranged around the first region RA1, for example, the data lines DL of the first group DLa and the data lines DL of the second group DLb are the same as those described above with reference to FIGS. 8 to 10, a repeated description thereof may not be provided again.

The data lines DL may include a third group DLc including data lines DL that detour around one side (e.g., the left side of the second region RA2 in FIG. 12A) of the second region RA2 and a fourth group DLd including data lines DL that detour around another side (e.g., the right side of the second region RA2 in FIG. 12A) of the second region RA2.

In a plan view, the data lines DL of the third group DLc and the data lines DL of the fourth group DLd may have shapes symmetric to each other. For example, a detouring portion DL-C of each of the data lines DL of the third group DLc and a detouring portion DL-C of each of the data lines DL of the fourth group DLd may have shapes symmetric to each other.

The data lines DL of the third group DLc and the data lines DL of the fourth group DLd may respectively extend in different directions from (e.g., away from) a second division point DP2. The data lines DL of the third group DLc may extend around a left edge of the second region RA2 from (e.g., away from) the second division point DP2, and the data lines DL of the fourth group DLd may extend around a right edge of the second region RA2 from (e.g., away from) the second division point DP2.

The second division point DP2 may be located on the same line as the second central line CL2. For example, the second division point DP2 may be located on a second virtual line DPL2, and the second virtual line DPL2 may be a second central line DL2.

Referring to FIG. 12B, a fifth data line DL5 and a sixth data line DL6 may respectively extend in opposite directions from (e.g., away from) the second division point DP2. A detouring portion DL5-C of the fifth data line DL5 may be located on one side of the second region RA2, for example, the left side of the second region RA2 and may extend around a portion of the second region RA2. A detouring portion DL6-C of the sixth data line DL6 may be located on another side of the second region RA2, for example, the right side of the second region RA2 and may extend around a portion of the second region RA2.

The fifth data line DL5 may include extension portions DL5-L and a detouring portion DL5-C, the extension portions DL5-L passing across the display area DA, and the detouring portion DL5-C connecting the extension portions DL5-L and being located in the intermediate area MA. The detouring portion DL5-C of the fifth data line DL5 may have substantially the same shape as that of a portion of the second region RA2. For example, in a plan view, the detouring portion DL5-C of the fifth data line DL5 may have a substantially semi-circular shape.

The sixth data line DL6 may include extension portions DL6-L and a detouring portion DL6-C, the extension portions DL6-L passing across the display area DA, and the detouring portion DL6-C connecting the extension portions DL6-L and being located in the intermediate area MA. The detouring portion DL6-C of the sixth data line DL6 may have substantially the same shape as that of a portion of the second region RA2. For example, in a plan view, the detouring portion DL6-C of the sixth data line DL6 may have a substantially semi-circular shape.

The detouring portion DL5-C of the fifth data line DL5 and the detouring portion DL6-C of the sixth data line DL6 may have substantially the same length. A central angle $\alpha 2$ of the detouring portion DL5-C of the fifth data line DL5 may be equal to a central angle $\beta 2$ of the detouring portion DL6-C of the sixth data line DL6. The central angle (e.g., central angle $\alpha 2$ or $\beta 2$) represents an angle formed by a virtual arc connecting a second center C2 and two opposite ends of the detouring portion DL-C (e.g., two opposite ends of detouring portion DL5-C or DL6-C) of each data line DL (e.g., the fifth data line DL5 or the sixth data line DL6) that detours around the second region RA2.

Although the signal lines in the y-direction (e.g., extending along, or passing across, in the y-direction) include data lines DL, and the data lines DL have an asymmetric shape with respect to the first virtual line DPL1, according to the embodiments described with reference to FIGS. 7 to 12B, the embodiments of the present disclosure are not limited thereto. In another embodiment, the above structure is applicable to signal lines in the x-direction (e.g., extending along, or passing across, in the x-direction). For example, the scan line SL, the previous scan line SL−1, the next scan line SL+1, and/or the emission control line EL described with reference to FIG. 6 may extend in the x-direction.

Figure 13:
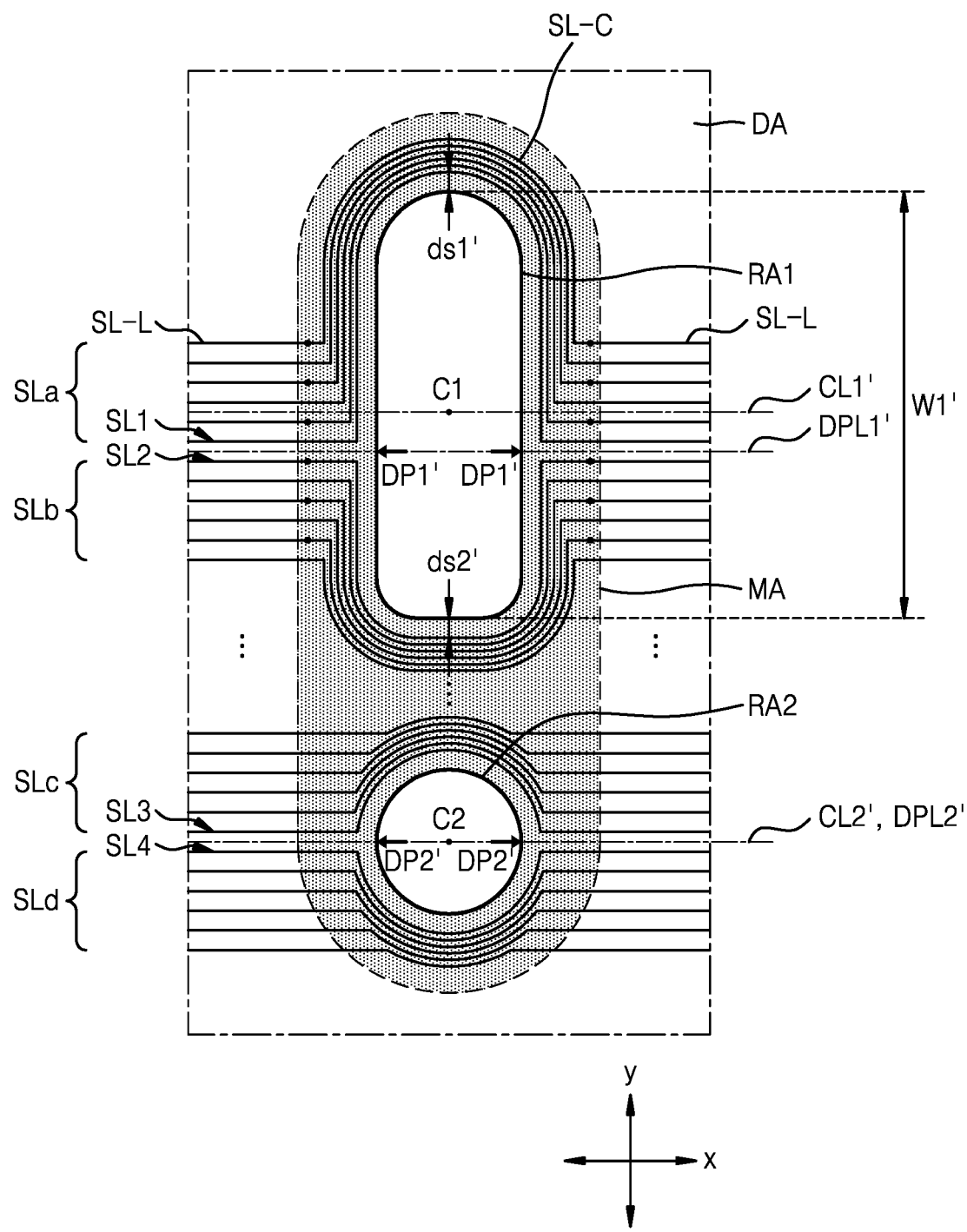
FIG. 13 is a plan view of a portion of a display panel according to an embodiment.

FIG. 13 is a plan view of a portion of the display panel 10 according to an embodiment. In an embodiment, it is shown in FIG. 13 that signal lines detouring around the first region RA1 and the second region RA2 include scan lines SL.

Referring to FIG. 13, the scan lines SL may extend in one direction (e.g., the x-direction). When the scan lines SL extend in one direction (e.g., the x-direction), the scan lines SL may extend in one direction (e.g., the x-direction) as a whole (e.g., may generally, or ultimately, extend in the x-direction). For example, the scan lines SL may extend in one direction (e.g., the x-direction) and locally detour around the surroundings of the first region RA1.

Each scan line SL may include extension portions SL-L and a detouring portion SL-C, the extension portions SL-L passing across the display area DA, and the detouring portion SL-C being located in the intermediate area MA and connecting the extension portions SL-L. The detouring portion SL-C may extend around a portion of the first region RA1 in the intermediate area MA.

The scan lines SL may include a first group SLa including scan lines and a second group SLb including scan lines, the first group SLa and the second group SLb being respectively arranged on two opposite sides (e.g., top and bottom sides) of a first virtual line DPL1'. The scan lines SL of the first group SLa and the scan lines SL of the second group SLb may be asymmetrically arranged with respect to the first virtual line DPL1'. For example, a planar shape of a detouring portion SL-C of each of the scan lines SL of the first group SLa may be different from a planar shape of a detouring portion SL-C of each of the scan lines SL of the second group SLb with respect to the first virtual line DPL1'.

A first scan line SL1, which is one of the scan lines SL of the first group SLa, and a second scan line SL2, which is one of the scan lines SL of the second group SLb, may respectively extend in opposite directions from (e.g., away from) a first division point DP1'. A detouring portion of the first scan line SL1 may extend around one side (e.g., a top side of the first region RA1 in FIG. 13) of the first region RA1, and a detouring portion of the second scan line SL2 may extend around another side (e.g., a bottom side of the first region RA1 in FIG. 13) of the first region RA1. In an embodiment, the detouring portion of the first scan line SL1 may have a semi-circular shape, and the detouring portion of the second scan line SL2 may have a quadrangular shape, for example, a quadrangular shape having round corners.

In a plan view, the first region RA1 may have a first width W1' in the y-direction and have an asymmetric shape with respect to a first central line CL1' passing through the first center C1 of the first width W1' and extending in the x-direction. One side of the first region RA1 may have an approximately (or substantially) semi-elliptical shape with respect to the first central line CL1', and another side of the first region RA1 may have an approximately (or substantially) quadrangular shape, for example, a quadrangular shape having round corners with respect to the first central line CL1'. In an embodiment, as described with reference to FIG. 2A, the display panel 10 may include the first hole 10H (see FIG. 2A) arranged in the first region RA1. In this case, the first region RA1 shown in FIG. 13 may have a planar shape of the first hole 10H.

The scan lines SL of the first group SLa may extend around the edge of the first region RA1 and maintain a first distance ds1' from the edge of the first region RA1. The first distance ds1' may have a constant value. For example, the detouring portion of the first scan line SL1 may be apart (e.g., spaced apart) from the edge of the first region RA1 by a constant interval. In some embodiments, a detouring portion of an innermost scan line of the scan lines of the first group SLa may be spaced apart from the edge of the first region RA1 by the first distance ds1' as the detouring portion extends around the first region RA1, and detouring portions of the other scan lines of the first group SLa may be spaced apart from the edge of the first region RA1 by at least the first distance ds1' as the detouring portions extend around the first region RA1.

Similarly, the scan lines SL of the second group SLb may extend around the edge of the first region RA1 and maintain a second distance ds2' from the edge of the first region RA1. The second distance ds2' may have a constant value. For example, the detouring portion of the second scan line SL2 may be apart (e.g., spaced apart) from the edge of the first region RA1 by a constant interval. The second distance ds2' may have the same value as the first distance ds1'. For example, in some embodiments, a detouring portion of an innermost scan line of the scan lines of the second group SLb may be spaced apart from the edge of the first region RA1 by the second distance ds2' as the detouring portion extends around the first region RA1, and detouring portions of the other scan lines of the second group SLb may be spaced apart from the edge of the first region RA1 by at least the second distance ds2' as the detouring portions extend around the first region RA1.

The first division point DP1' may be located on the first virtual line DPL1', and the first virtual line DPL1' may be apart (e.g., spaced apart) in the y-direction from the first central line CL1'. The detouring portion of the first scan line SL1 and the detouring portion of the second scan line SL2 may have substantially the same length, and thus a resistance difference between the scan lines may be reduced or minimized and the corresponding deterioration of a display quality may be reduced or minimized as described above.

The display panel 10 may include the second region RA2 neighboring the first region RA1. As shown in FIG. 13, the second region RA2 may have a shape symmetric with respect to a second central line CL2' passing through the second center C2 of the second region RA2 and extending in the x-direction.

The scan lines SL may include a third group SLc including scan lines and a fourth group SLd including scan lines, the third group SLc detouring around one side (e.g., a top side of the second region RA2 in FIG. 13) of the second region RA2, and the fourth group SLd detouring around another side (e.g., a bottom side of the second region RA2 in FIG. 13) of the second region RA2.

In a plan view, the scan lines SL of the third group SLc and the scan lines SL of the fourth group SLd may have symmetric shapes. For example, a detouring portion SL-C of each of the scan lines SL of the third group SLc may have a shape symmetric to a shape of a detouring portion SL-C of each (or of a corresponding one) of the scan lines SL of the fourth group SLd.

The scan lines SL of the third group SLc and the scan lines SL of the fourth group SLd may respectively extend in different directions from (e.g., away from) a second division point DP2'. The scan lines SL of the third group SLc may extend around a top edge of the second region RA2 from (e.g., away from) the second division point DP2', and the scan lines SL of the fourth group SLd may extend around a bottom edge of the second region RA2 from (e.g., away from) the second division point DP2'.

The second division point DP2' may be located on the same line as the second central line CL2'. For example, the second division point DP2' may be located on a second virtual line DPL2', and the second virtual line DPL2' may be the second central line CL2'.

Figure 14A:
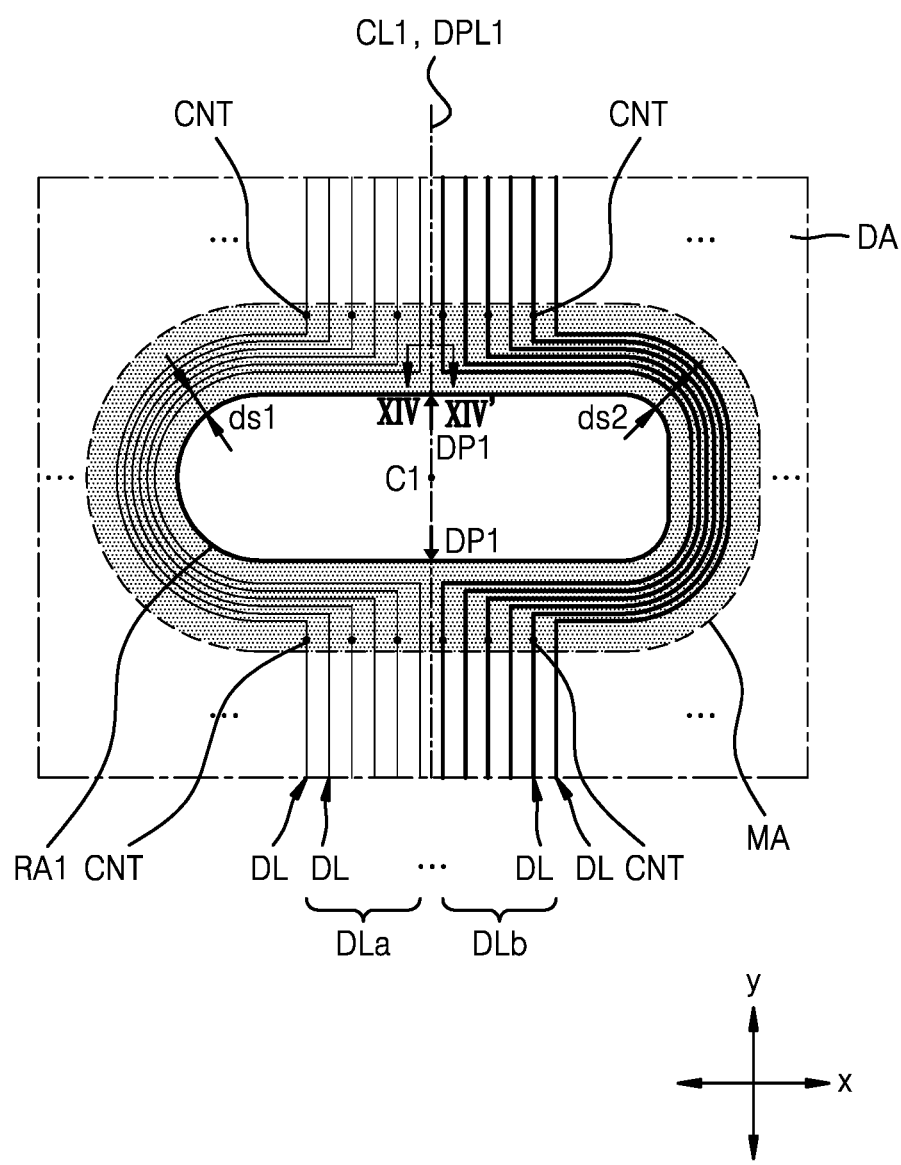
FIG. 14A is a plan view of a portion of a display panel according to an embodiment.
Figure 14B:
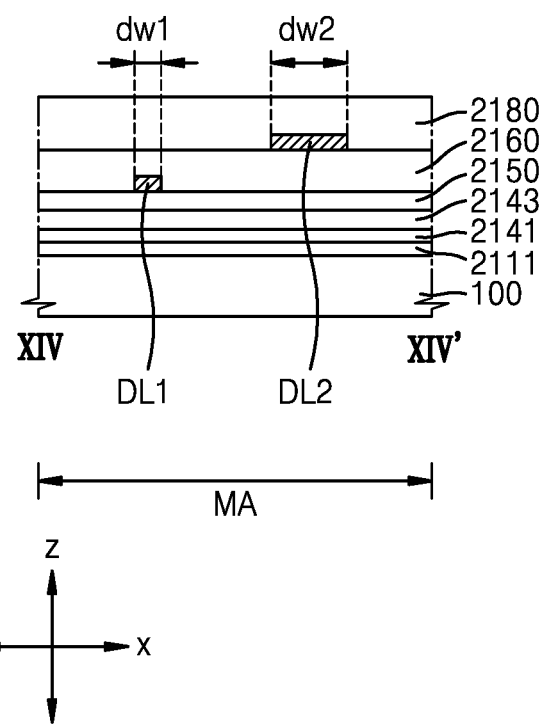
FIG. 14B is a cross-sectional view of the display panel taken along line XIV-XIV' of FIG. 14A.

FIG. 14A is a plan view of a portion of the display panel 10 according to an embodiment, and FIG. 14B is a cross-sectional view of the display panel 10 taken along line XIV-XIV' of FIG. 14A. FIG. 14A shows a case where a signal line detouring around the first region RA1 is a data line.

Referring to FIG. 14A, data lines DL may include a first group DLa and a second group DLb, the first group DLa including data lines DL arranged on the left of the first virtual line DPL1, and the second group DLb including data lines DL arranged on the right of the first virtual line DPL1.

The data lines DL of the first group DLa and the data lines DL of the second group DLb may be asymmetrically arranged with respect to the first virtual line DPL1. For example, detouring portions DL-C of the data lines DL of the first group DLa and detouring portions DL-C of the data lines DL of the second group DLb may have an asymmetric shape with respect to the first virtual line DPL1 in a plan view.

As described above (e.g., with reference to FIG. 7, etc.) the first region RA1 may have an asymmetric shape with respect to the first central line CL1. The detouring portions DL-C of the data lines DL of the first group DLa may maintain a constant interval (e.g., a first distance ds1) from an edge of the first region RA1. Similarly, the detouring portions DL-C of the data lines DL of the second group DLb may maintain a constant interval (e.g., a second distance ds2) from an edge of the first region RA1.

The first central line CL1 may be the same as the first virtual line DPL1. In this case, the detouring portions DL-C of the data lines DL of the first group DLa, and the detouring portions DL-C of the data lines DL of the second group DLb may have different lengths. In this case, brightness reduction and/or a color deviation may be caused, but a width or a thickness of at least a portion of each data line DL of the first group DLa may be different from a width or a thickness, respectively, of at least a portion of each data line DL of the second group DLb. In an embodiment, as shown in FIGS. 14A and 14B, a width of at least a portion of each data line DL of the first group DLa may be less than a width of at least a portion of each data line DL of the second group DLb.

Referring to FIG. 14B, a width dw1 of at least a portion of a first data line DL1 of the first group DLa may be less than a width dw2 of at least a portion of a second data line DL2 of the second group DLb. In an embodiment, a width dw2 of a portion of the second data line DL2 located in the intermediate area MA among the data lines DL of the second group DLb may be greater than a width dw1 of a portion of the first data line DL1 located in the intermediate area MA among the data lines DL of the first group DLa. In an embodiment, a length of a detouring portion of the second data line DL2 may be greater than a length of a detouring portion of the first data line DL1, and the width dw2 of the detouring portion of the second data line DL2 may be greater than the width dw1 of the detouring portion of the first data line DL1.

With this structure, a resistance deviation between the first data line DL1 and the second data line DL2 may be reduced, and thus a brightness reduction and/or a color deviation may be prevented, minimized, or reduced.

Figure 15:
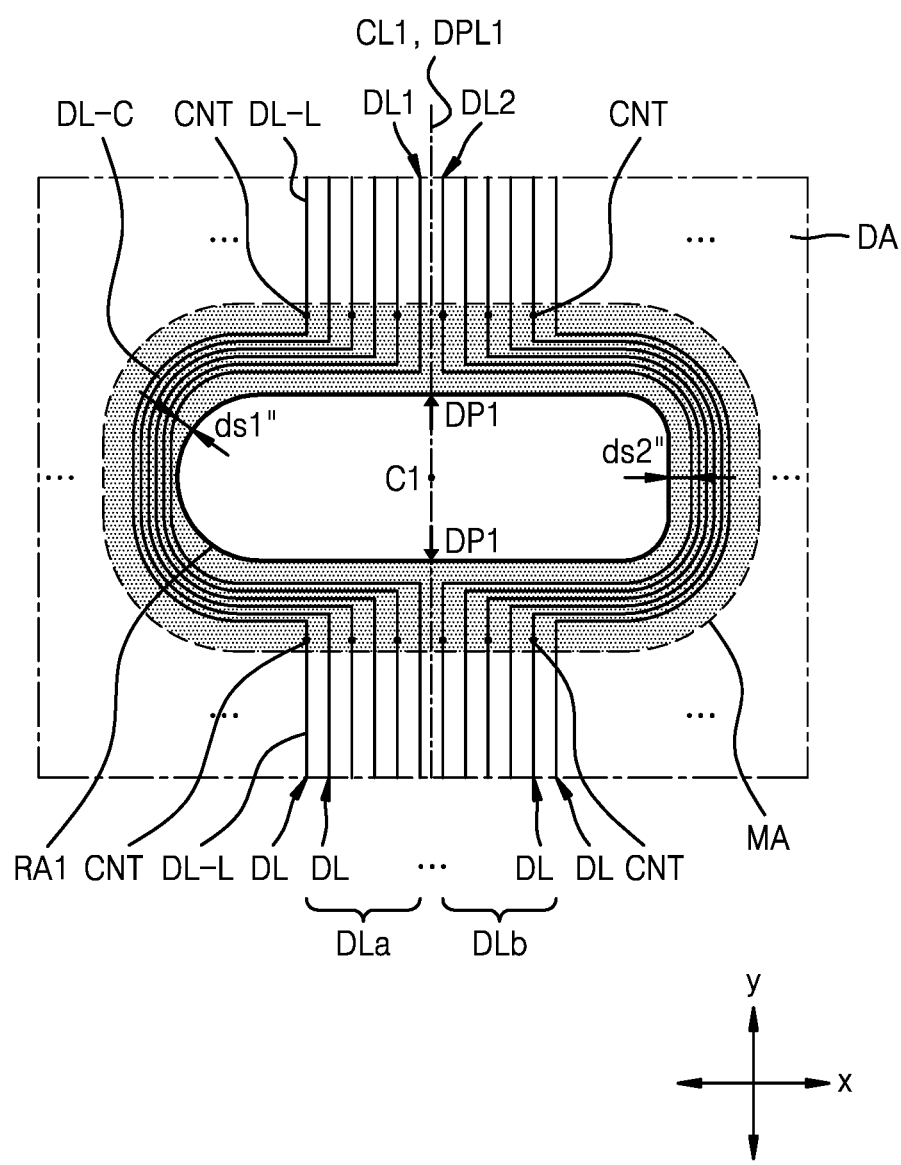
FIG. 15 is a plan view of a portion of a display panel according to an embodiment.

FIG. 15 is a plan view of a portion of the display panel 10 according to an embodiment. FIG. 15 shows a case where a signal line detouring around the first region RA1 is a data line.

Referring to FIG. 15, data lines DL may detour around the first region RA1. The data lines DL may be symmetrically arranged with respect to the first virtual line DPL1 on which the first division point DP1 is located. The data lines DL may include a first group DLa and a second group DLb, the first group DLa including data lines DL arranged on one side (e.g., the left side) of the first virtual line DPL1, and the second group DLb including data lines DL arranged on another side (e.g., the right side) of the first virtual line DPL1. The data lines DL of the first group DLa and the data lines DL of the second group DLb may be symmetrically arranged with respect to the first virtual line DPL1. For example, detouring portions DL-C of the data lines DL of the first group DLa and detouring portions DL-C of the data lines DL of the second group DLb may have symmetric shapes with respect to the first virtual line DPL1 in a plan view.

As described above (e.g., with reference to FIG. 7), the first region RA1 may have an asymmetric shape with respect to the first central line CL1. In a plan view, the shape of the first region RA1 may be different from the shape of the detouring portions DL-C of the data lines DL of the first group DLa and/or the shape of the data lines DL of the second group DLb. For example, in some embodiments, the shape of the detouring portions DL-C of the data lines DL of the first group DLa may have substantially the same shape as that of the portion of the first region RA1 that they extend around, and the shape of the detouring portions DL-C of the data lines DL of the second group DLb may have substantially the same shape as that of the portion of the first region RA1 that they extend around. Therefore, the detouring portions DL-C of the data lines DL of the first group DLa may have a first distance ds1" from an edge of the first region RA1 (e.g., may be spaced apart from the first region RA1 by the first distance ds1"), and the first distance ds1" may have a variable value depending on a measurement point. For example, the first distance ds1" may vary as the detouring portions DL-C of the data lines DL of the first group DLa extend around a portion of the first region RA1. In contrast, the detouring portions DL-C of the data lines DL of the second group DLb may have a second distance ds2" from an edge of the first region RA1 (e.g., may be spaced apart from the first region RA1 by the second distance ds2"), and the second distance ds2" may have a constant value.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and the equivalents thereof.

What is claimed is:

1. A display panel, the display panel having at least one hole inside a display area and comprising:
    a substrate;
    a plurality of display elements on the substrate, the plurality of display elements arranged two-dimensionally around the at least one hole and defining the display area; and
    a plurality of signal lines electrically connected to the plurality of display elements and extending in a first direction,
    wherein the at least one hole includes a first hole, the first hole having a first width in a second direction different from the first direction and having two sides which have asymmetric shapes with respect to a first central line passing through a center of the first width,
    wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side, and
    wherein the first signal line and the second signal line are asymmetric with respect to a first virtual line between the first signal line and the second signal line.

2. The display panel of claim 1, wherein the first virtual line is spaced apart in the second direction from the first central line.

3. The display panel of claim 1, further comprising an intermediate area located between the first hole and the display area,
wherein the first signal line includes a first detouring portion that detours around the first side of the first hole in the intermediate area, and the second signal line includes a second detouring portion that detours around the second side of the first hole in the intermediate area.

4. The display panel of claim 3, wherein the first detouring portion and the second detouring portion have an asymmetric shape with respect to the first virtual line.

5. The display panel of claim 3, wherein a first distance interval between the first signal line and the second signal line in the display area is greater than a second distance interval between the first signal line and the second signal line in the intermediate area.

6. The display panel of claim 1, wherein one of the first signal line and the second signal line includes:
a first conductive layer; and
a second conductive layer located on the first conductive layer with an insulating layer therebetween, the second conductive layer being connected to the first conductive layer through a contact hole in the insulating layer.

7. The display panel of claim 1,
wherein the plurality of signal lines further include:
a third signal line located on one side of the second signal line with the first signal line therebetween; and
a fourth signal line located on one side of the first signal line with the second signal line therebetween, and
wherein the third signal line and the fourth signal line are asymmetric with respect to the first virtual line.

8. The display panel of claim 7,
wherein each of the first signal line and the third signal line includes:
an extension portion extending in the first direction; and
a detouring portion connected to the extension portion and arranged around the first side of the first hole, and
wherein a first connection point between the extension portion and the detouring portion of the first signal line, and a second connection point between the extension portion and the detouring portion of the third signal line are arranged on a first virtual oblique line that is oblique with respect to the first direction and the second direction.

9. The display panel of claim 1, wherein the plurality of signal lines include data lines or scan lines.

10. The display panel of claim 1, wherein each of the plurality of display elements includes an organic light-emitting diode.

11. A display panel, the display panel having a first hole and comprising:
a plurality of display elements arranged two-dimensionally around the first hole; and
a plurality of signal lines electrically connected to the plurality of display elements and extending in a first direction,
wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side,
wherein the first signal line and the second signal line are asymmetric with respect to a first virtual line between the first signal line and the second signal line,
wherein the plurality of signal lines further include a third signal line located on one side of the second signal line with the first signal line therebetween,
wherein each of the first signal line and the third signal line includes:
an extension portion extending in the first direction; and
a detouring portion connected to the extension portion and detouring around the first side of the first hole, and
wherein a first connection point between the extension portion of the first signal line and the detouring portion of the first signal line, and a second connection point between the extension portion of the third signal line and the detouring portion of the third signal line are arranged along a first virtual oblique line that is oblique with respect to the first direction.

12. The display panel of claim 11,
wherein the second signal line includes:
extension portions each extending in the first direction and being spaced apart from each other; and
a detouring portion connected to each of the extension portions,
wherein the first signal line includes extension portions including the extension portion, the extension portions of the first signal line extending in the first direction, and the detouring portion of the first signal line being connected to each of the extension portions of the first signal line,
wherein the detouring portion of the second signal line detours around the second side of the first hole, and
wherein the detouring portion of the first signal line and the detouring portion of the second signal line are asymmetric with respect to the first virtual line.

13. The display panel of claim 12, wherein the plurality of signal lines further include:
a fourth signal line located on one side of the first signal line with the second signal line therebetween, and
the third signal line and the fourth signal line are asymmetric with respect to the first virtual line.

14. The display panel of claim 13,
wherein the fourth signal line includes:
an extension portion extending in the first direction; and
a detouring portion connected to the extension portion and arranged around the second side of the first hole, and
wherein a third connection point between one of the extension portions and the detouring portion of the second signal line, and a fourth connection point between the extension portion and the detouring portion of the fourth signal line are arranged along a second virtual oblique line that is oblique with respect to the first direction.

15. The display panel of claim 12,
wherein the detouring portion of the first signal line is spaced apart by a constant distance from the first side of the first hole, and
the detouring portion of the second signal line is spaced apart by a constant distance from the second side of the first hole.

16. An electronic apparatus, comprising:
the display panel of claim 11; and
at least one component corresponding to the first hole of the display panel,
wherein the second signal line includes a detouring portion that detours around the second side of the first hole, and
wherein the detouring portion of the first signal line and the detouring portion of the second signal line are asymmetric with respect to the first virtual line.

17. The electronic apparatus of claim 16,
wherein the plurality of signal lines further include:
a fourth signal line located on one side of the first signal line with the second signal line therebetween and including a detouring portion that detours around the second side of the first hole, and
wherein the detouring portion of the third signal line and the detouring portion of the fourth signal line are asymmetric with respect to the first virtual line.

18. A display panel, the display panel having a first hole and comprising:
a plurality of display elements arranged two-dimensionally around the first hole; and
a plurality of signal lines electrically connected to the plurality of display elements and extending in a first direction,
wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side,
wherein the first signal line and the second signal line are asymmetric with respect to a first virtual line between the first signal line and the second signal line,
wherein the display panel includes:
a substrate;
a display layer on the substrate and including the plurality of display elements; and
an encapsulation layer on the display layer, and
wherein the first hole passes through a stacked structure including the substrate, the display layer, and the encapsulation layer.

19. An electronic apparatus comprising:
a display panel having a first hole and a second hole spaced apart from the first hole;
at least one component corresponding to the first hole of the display panel; and
an additional component corresponding to the second hole,
wherein the display panel includes:
a plurality of display elements arranged two-dimensionally around the first hole; and
a plurality of signal lines electrically connected to the plurality of display elements and extending in a first direction,
wherein each of a first signal line of the plurality of signal lines and a second signal line of the plurality of signal lines and neighboring the first signal line extends in the first direction, the first signal line includes a first detouring portion that detours around a first side of the first hole, the second signal line includes a second detouring portion that detours around a second side of the first hole opposite to the first side, and
wherein the first detouring portion of the first signal line and the second detouring portion of the second signal line are asymmetric with respect to a first virtual line between the first signal line and the second signal line.

20. The electronic apparatus of claim 19, wherein the at least one component includes an electronic element that emits light or receives light through the first hole.

21. The electronic apparatus of claim 20, wherein the electronic element includes a camera, a sensor to recognize a portion of a human body, or a lamp to output light.

22. A display panel, the display panel having a first hole and comprising:
a plurality of display elements arranged two-dimensionally around the first hole; and
a plurality of signal lines electrically connected to the plurality of display elements and extending in a first direction,
wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side,
wherein the first signal line and the second signal line are asymmetric with respect to a first virtual line between the first signal line and the second signal line, and
wherein the first signal line includes:
a first conductive layer; and
a second conductive layer located on the first conductive layer with an insulating layer therebetween, the second conductive layer being connected to the first conductive layer through a contact hole in the insulating layer.

23. The display panel of claim 22,
wherein each of the first signal line and the second signal line includes:
extension portions each extending in the first direction and being spaced apart from each other; and
a detouring portion connected to each of the extension portions,
wherein the detouring portion of the first signal line detours around the first side of the first hole, and the detouring portion of the second signal line detours around the second side of the first hole,
wherein the detouring portion of the first signal line and the detouring portion of the second signal line are asymmetric with respect to the first virtual line,
wherein the plurality of signal lines further include:
a third signal line located on one side of the second signal line with the first signal line therebetween; and
a fourth signal line located on one side of the first signal line with the second signal line therebetween,
the third signal line and the fourth signal line are asymmetric with respect to the first virtual line, and
wherein the fourth signal line includes:
a first conductive layer; and
a second conductive layer located on the first conductive layer of the fourth signal line with an insulating layer therebetween, the second conductive layer of the fourth signal line being connected to the first conductive layer of the fourth signal line through a contact hole in the insulating layer between the first and second conductive layers of the fourth signal line.

24. A display panel, the display panel having a first hole and comprising:
a plurality of display elements arranged two-dimensionally around the first hole; and a plurality of signal lines electrically connected to the plurality of display elements and extending in a first direction, wherein each of a first signal line of the plurality of signal lines and a second signal line of the plurality of signal lines and neighboring the first signal line extends in the first direction, the first signal line detours around a first side of the first hole, and the second signal line detours around a second side of the first hole opposite to the first side, wherein the first signal line and the second signal line are asymmetric with respect to a first virtual line between the first signal line and the second signal line, and wherein the first hole has a first width in a second direction different from the first direction and two sides of the first hole have an asymmetric shape with respect to a first central line passing through a center of the first width.

25. The display panel of claim 24,
wherein each of the first signal line and the second signal line includes:
  extension portions each extending in the first direction and being spaced apart from each other; and
  a detouring portion connected to each of the extension portions,
wherein the detouring portion of the first signal line detours around the first side of the first hole, and the detouring portion of the second signal line detours around the second side of the first hole,
wherein the detouring portion of the first signal line and the detouring portion of the second signal line are asymmetric with respect to the first virtual line, and
wherein the first central line passes through the center of the first width in the first direction.

26. The display panel of claim 25, wherein the first virtual line is spaced apart from the first central line in the second direction.

27. The display panel of claim 25,
wherein the first virtual line and the first central line are the same line, and
wherein a width of one of the detouring portion of the first signal line and the detouring portion of the second signal line is greater than a width of the other of the detouring portion of the first signal line and the detouring portion of the second signal line, or a thickness of the one of the detouring portion of the first signal line and the detouring portion of the second signal line is greater than a thickness of the other of the detouring portion of the first signal line and the detouring portion of the second signal line.

28. An electronic apparatus, comprising:
the display panel of claim 24; and
at least one component corresponding to the first hole of the display panel,
wherein the first signal line includes a first detouring portion that detours around the first side of the first hole,
wherein the second signal line includes a second detouring portion that detours around the second side of the first hole, and
wherein the first and second detouring portions are asymmetric with respect to the first virtual line.

29. The electronic apparatus of claim 28, wherein the first virtual line is spaced apart in the second direction from the first central line.

30. The electronic apparatus of claim 28,
wherein the first virtual line and the first central line are the same line, and
wherein a width of one of the first detouring portion and the second detouring portion is greater than a width of the other of the first detouring portion and the second detouring portion, or a thickness of the one of the first detouring portion and the second detouring portion is greater than a thickness of the other of the first detouring portion and the second detouring portion.

* * * * *